United States Patent
Nagahisa et al.

(10) Patent No.: US 12,520,550 B2
(45) Date of Patent: Jan. 6, 2026

(54) SILICON CARBIDE SEMICONDUCTOR DEVICE AND POWER CONVERTER

(71) Applicant: Mitsubishi Electric Corporation, Tokyo (JP)

(72) Inventors: Yuichi Nagahisa, Tokyo (JP); Takanori Tanaka, Tokyo (JP); Hiroyuki Amishiro, Tokyo (JP); Naoyuki Kawabata, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 499 days.

(21) Appl. No.: 18/008,448

(22) PCT Filed: Aug. 11, 2020

(86) PCT No.: PCT/JP2020/030578
§ 371 (c)(1),
(2) Date: Dec. 6, 2022

(87) PCT Pub. No.: WO2022/034636
PCT Pub. Date: Feb. 17, 2022

(65) Prior Publication Data
US 2023/0215921 A1    Jul. 6, 2023

(51) Int. Cl.
*H10D 62/832* (2025.01)
*H10D 12/01* (2025.01)
*H10D 62/10* (2025.01)

(52) U.S. Cl.
CPC ....... *H10D 62/8325* (2025.01); *H10D 12/031* (2025.01); *H10D 62/106* (2025.01)

(58) Field of Classification Search
CPC . H10D 12/031; H10D 62/106; H10D 62/8325
(Continued)

(56) References Cited

U.S. PATENT DOCUMENTS

2017/0053984 A1   2/2017   Sugawara et al.
2018/0076290 A1   3/2018   Takayanagi et al.
(Continued)

FOREIGN PATENT DOCUMENTS

JP   2018-46162 A    3/2018
WO   2015/166754 A1   11/2015
(Continued)

OTHER PUBLICATIONS

International Search Report and Written Opinion mailed on Nov. 10, 2020, received for PCT Application PCT/JP2020/030578, filed on Aug. 11, 2020, 9 pages including English Translation.
(Continued)

*Primary Examiner* — Igwe U Anya
(74) *Attorney, Agent, or Firm* — XSENSUS LLP

(57) ABSTRACT

A silicon carbide layer has an active region and an outer peripheral region arranged along an outer periphery of the active region in an in-plane direction. First well regions are arranged in the active region. A second well region is arranged in the outer peripheral region. Ohmic electrodes are arranged on a second surface of the silicon carbide layer, are connected to a source electrode, are electrically and ohmically connected to the first well regions, and have surface regions ohmically contacting a part forming the second surface of the silicon carbide layer and having a second conductivity type. The active region includes a standard region part and a thinned region part between the standard region part and the outer peripheral region. The surface regions are arranged at surface density lower in the thinned region part than in the standard region part in a plan view.

17 Claims, 18 Drawing Sheets

(58) Field of Classification Search
USPC .......................................................... 257/77
See application file for complete search history.

(56) References Cited

U.S. PATENT DOCUMENTS

| | | | |
|---|---|---|---|
| 2019/0057873 A1 | 2/2019 | Sugahara et al. | |
| 2019/0371935 A1 | 12/2019 | Hatta et al. | |
| 2020/0127098 A1* | 4/2020 | Yamashiro | H10D 64/64 |
| 2020/0295177 A1* | 9/2020 | Hino | H10D 30/60 |

FOREIGN PATENT DOCUMENTS

| | | |
|---|---|---|
| WO | 2015/189929 A1 | 12/2015 |
| WO | 2017/169086 A1 | 10/2017 |
| WO | 2018/155553 A1 | 8/2018 |

OTHER PUBLICATIONS

Ohno et al., "Influence of growth conditions on basal plane dislocation in 4H—SiC epitaxial layer", Journal of Crystal Growth, vol. 271, Sep. 13, 2004, pp. 1-7.
Tawara et al., "Short minority carrier lifetimes in highly nitrogen-doped 4H—SiC epilayers for suppression of the stacking fault formation in PiN diodes", Journal of Applied Physics, vol. 120, 2016, pp. 115101-1-115101-7.

* cited by examiner

SILICON CARBIDE SEMICONDUCTOR DEVICE AND POWER CONVERTER

CROSS-REFERENCE TO RELATED APPLICATION

The present application is based on PCT filing PCT/JP2020/030578, filed Aug. 11, 2020, the entire contents of which are incorporated herein by reference.

TECHNICAL FIELD

The present disclosure relates to a silicon carbide semiconductor device and a power converter, particularly relates to a silicon carbide semiconductor device with an ohmic electrode and a power converter including the silicon carbide semiconductor device.

BACKGROUND ART

Semiconductor devices using silicon carbide (SiC) are widely used lately as power semiconductor devices. Typically, an SiC semiconductor device includes a single crystalline SiC substrate and an SiC layer as an epitaxial layer formed on the single crystalline SiC substrate. If this device includes the configuration of a pn diode, flowing a forward current, specifically, a bipolar current continuously in the pn diode may cause stacking fault in crystal in the SiC layer. A possible reason for this is that recombination energy resulting from recombination of minority carriers injected through a pn junction of the pn diode with majority carriers causes the stacking fault as a plane defect to extend in the SiC layer from basal plane dislocation (BPD) as a starting point existing in the SiC substrate, for example. The extension of the stacking fault causes characteristic degradation such as increase in forward current (ON voltage) due to inhibited current flow and reduction in breakdown voltage.

The above-described characteristic degradation may occur not only in a case where a semiconductor device is a simple pn diode but also in a case where the semiconductor device is a vertical metal oxide semiconductor field effect transistor (MOSFET). The reason for this is that the vertical MOSFET has an internal body diode (parasitic diode) between a source and a drain and this diode is a type of pn diode. More specifically, if the body diode functions as a free-wheeling diode of the MOSFET in a power electronics system, the above-described characteristic degradation is caused by the flow of a forward current in the body diode.

As disclosed in PCT International Publication No. 2018/155553 (Patent Document 1), for example, an SiC-MOSFET and an SiC-Schottky barrier diode (SBD) both use an epitaxial layer grown on an SiC substrate as a breakdown voltage retaining layer. Normally, a large number of defects exist in the SiC substrate and these defects include a defect as a starting point of extension of stacking fault in the epitaxial layer. In response to this, for the purpose of increasing the quality of the epitaxial layer grown on the SiC substrate, various attempts have been made for a long time for making various types of defects harmless.

As a method of suppressing the above-described characteristic degradation caused by the flow of a forward current in a body diode, consideration has been given so far mainly to three methods described next. According to a first method under consideration, in growing an epitaxial layer on an SiC substrate, basal plane dislocation to be transferred from the SiC substrate to the epitaxial layer is converted at an initial stage of the growth from the basal plane dislocation to threading edge dislocation, thereby preventing extension of stacking fault from the basal plane dislocation (see Non-Patent Document 1, for example). According to a second method under consideration, recombination between holes and electrons is encouraged using a buffer layer of a high impurity concentration formed on an SiC substrate, thereby preventing the occurrence of stacking fault resulting from basal plane dislocation in the SiC substrate (see Non-Patent Document 2, for example). According to a third method under consideration, a recombination center is introduced into a region in the presence of a parasitic pn diode to reduce holes to be injected, thereby preventing recombination between holes and electrons in the vicinity of basal plane dislocation in an SiC substrate (see Patent Document 2, for example).

PRIOR ART DOCUMENTS

Patent Document(s)

Patent Document 1: PCT International Publication No. 2018/155553
Patent Document 2: PCT International Publication No. 2015/189929

Non-Patent Document(s)

Non-Patent Document 1: "Influence of growth conditions on basal plane dislocation in 4H-SiC epitaxial layer," Journal of Crystal Growth 271 (2004) 1-7
Non-Patent Document 2: "Short minority carrier lifetimes in highly nitrogen-doped 4H-SiC epilayers for suppression of the stacking fault formation in PiN diodes," JOURNAL OF APPLIED PHYSICS Vol. 120, 115101 (2016)

SUMMARY

Problem to be Solved by the Invention

The present inventors have found that all the above-described conventional methods do not give sufficient consideration to a difference in bipolar current density in a semiconductor chip. More specifically, the present inventors discovered that the bipolar current density is increased locally in a local region in the vicinity of a boundary between an active region and an outer peripheral region in the chip. Then, the present inventors have arrived at the thought by giving further consideration to effect of a distribution of such bipolar current density that, while simply applying the above-described conventional methods allows extension of stacking fault to be suppressed in most part of a chip region, sufficiently suppressing the extension may be impossible in the foregoing local region. This problem will be described below in more detail.

To apply the above-described first method effectively, it is necessary to form a point of conversion from basal plane dislocation to threading edge dislocation at a position as deep as possible from a surface of the epitaxial layer. Hence, the epitaxial layer is required to be thicker in order to achieve sufficient effect also in the foregoing local region by simply applying the first method. This causes considerable increase in manufacturing cost for a chip.

To apply the above-described second method effectively, it is necessary to form a buffer layer sufficiently thick enough to prevent penetration of minority carriers satisfactorily. Hence, the buffer layer is required to be thicker in order to achieve sufficient effect also in the foregoing local region by simply applying the second method. This causes considerable increase in manufacturing cost for a chip.

To apply the above-described third method effectively, it is necessary to introduce a recombination center into a region in the presence of the pn diode to a degree allowing sufficient reduction in holes to be injected. Hence, in order to achieve sufficient effect also in the foregoing local region by simply applying the third method, it is necessary to introduce more recombination centers into the outer peripheral region and in the vicinity of the outer peripheral region or to introduce more recombination centers into a chip as a whole. The former case causes increase in the number of process steps, increase in the number of masks used in photolithography, etc., thereby causing considerable increase in manufacturing cost for the chip. In the latter case, as a recombination center is generally a defect such as a point defect, the presence of excessive recombination centers causes reduction in breakdown voltage, increase in ON voltage, and increase in leakage current.

As described above, trying to suppress extension of stacking fault also in the foregoing local region by simply applying the conventional methods causes another factor for considerable increase in manufacturing cost or characteristic degradation.

The present disclosure has been made to solve the problems described so far. It is an object of the present disclosure to provide a silicon carbide semiconductor device allowing suppression of characteristic degradation while avoiding considerable increase in manufacturing cost.

Means to Solve the Problem

A silicon carbide semiconductor device according to one aspect of the present disclosure includes a silicon carbide substrate, a silicon carbide layer, a gate insulating film, a gate electrode, a gate pad, a source electrode, and a plurality of ohmic electrodes. The silicon carbide substrate has a first conductivity type. The silicon carbide layer has a first surface facing the silicon carbide substrate and a second surface opposite the first surface in a thickness direction, and has an active region and an outer peripheral region arranged along an outer periphery of the active region in an in-plane direction vertical to the thickness direction. The silicon carbide layer includes a drift layer, a plurality of first well regions, a plurality of source regions, and a second well region. The drift layer is arranged on the silicon carbide substrate and has the first conductivity type. The first well regions are arranged on the drift layer in the active region, have a second conductivity type different from the first conductivity type, and are separated from each other at least in one sectional view. The source regions are arranged on the first well regions and have the first conductivity type. The second well region is arranged on the drift layer in the outer peripheral region and has the second conductivity type. The gate insulating film faces the first well regions. The gate electrode has a part arranged over the active region and facing the first well regions across the gate insulating film, and a part arranged over the outer peripheral region and insulated from the second well region. The gate pad is arranged over the second well region, insulated from the second well region, and connected to the gate electrode. The source electrode is provided over the second surface of the silicon carbide layer. The ohmic electrodes are provided on the second surface of the silicon carbide layer, connected to the source electrode, electrically and ohmically connected to the first well regions, and have a plurality of surface regions ohmically contacting a part of the second surface of the silicon carbide layer; the part of the second surface of the silicon carbide layer has the second conductivity type. The active region includes a standard region part and a thinned region part between the standard region part and the outer peripheral region. The surface regions are arranged at surface density lower in the thinned region part than in the standard region part in a plan view.

A silicon carbide semiconductor device according to another aspect of the present disclosure includes a silicon carbide substrate, a silicon carbide layer, a gate insulating film, a gate electrode, a gate pad, a source electrode, and a plurality of ohmic electrodes. The silicon carbide substrate has a first conductivity type. The silicon carbide layer has a first surface facing the silicon carbide substrate and a second surface opposite the first surface in a thickness direction, and has an active region and an outer peripheral region arranged along an outer periphery of the active region in an in-plane direction vertical to the thickness direction. The silicon carbide layer includes a drift layer, a plurality of first well regions, a plurality of source regions, and a second well region. The drift layer is arranged on the silicon carbide substrate and has the first conductivity type. The first well regions are arranged on the drift layer in the active region, have a second conductivity type different from the first conductivity type, and are separated from each other at least in one sectional view. The source regions are arranged on the first well regions and have the first conductivity type. The second well region is arranged on the drift layer in the outer peripheral region and has the second conductivity type. The gate insulating film faces the first well regions. The gate electrode has a part arranged over the active region and facing the first well regions across the gate insulating film, and a part arranged over the outer peripheral region and insulated from the second well region. The gate pad is arranged over the second well region, insulated from the second well region, and connected to the gate electrode. The source electrode is provided over the second surface of the silicon carbide layer. The ohmic electrodes are provided on the second surface of the silicon carbide layer, connected to the source electrode, electrically and ohmically connected to the first well regions and the second well region, and have a plurality of surface regions ohmically contacting a part of the second surface of the silicon carbide layer; the part of the second surface of the silicon carbide layer has the second conductivity type. The outer peripheral region includes an external region part and a thinned region part between the external region part and the active region. The surface regions are arranged at surface density lower in the thinned region part than in the active region in a plan view.

Effects of the Invention

According to the present disclosure, it is possible to suppress characteristic degradation of a silicon carbide semiconductor device while considerable increase in manufacturing cost is avoided.

These and other objects, features, aspects and advantages of the present disclosure will become more apparent from the following detailed description of the present disclosure and the accompanying drawings.

DESCRIPTION OF EMBODIMENT(S)

Embodiments of the present disclosure will be described below on the basis of the drawings. In each embodiment shown in the present description, an MOSFET explained as an example of a silicon carbide semiconductor device is an n-channel MOSFET, namely, an MOSFET in which a first conductivity type is an n-type and a second conductivity type is a p-type. Statement of a potential level according to this explanation applies to a case where the first conductivity type is an n-type and the second conductivity type is a p-type. A potential level is reversed if the first conductivity type is a p-type and the second conductivity type is an n-type.

1. First Embodiment

<1-1. Basic Configuration>

Figure 1:
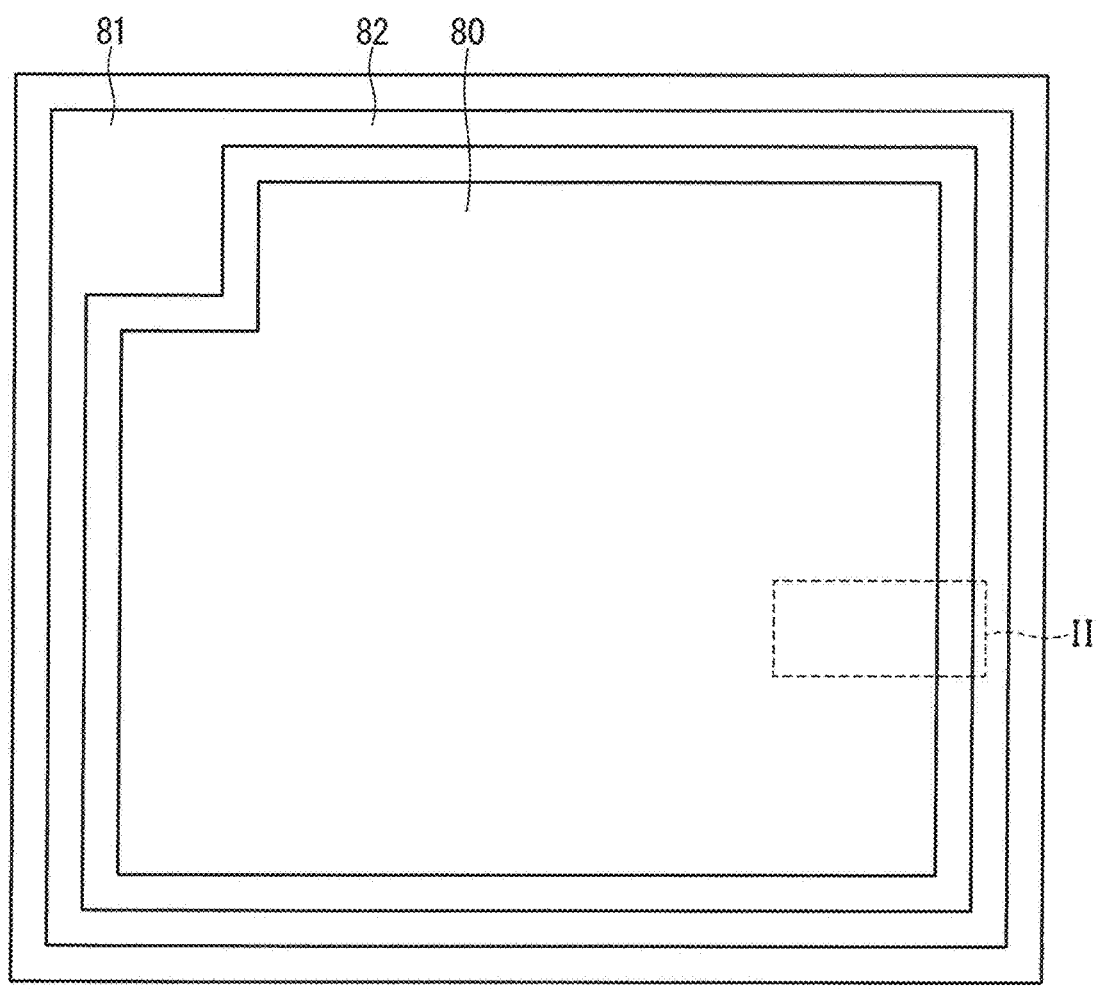
FIG. 1 is a top view schematically showing the configuration of a silicon carbide semiconductor device semiconductor device according to a first embodiment.

FIG. 1 is a top view schematically showing the configuration of an MOSFET 711 (silicon carbide semiconductor device) according to a first embodiment. The MOSFET 711 includes a source electrode 80, a gate pad 81, and a gate interconnect line 82 that are provided at an upper surface of the MOSFET 711. The gate interconnect line 82 extends from the gate pad 81 and the source electrode 80 is arranged away from the gate pad 81 and the gate interconnect line 82.

Figure 2:
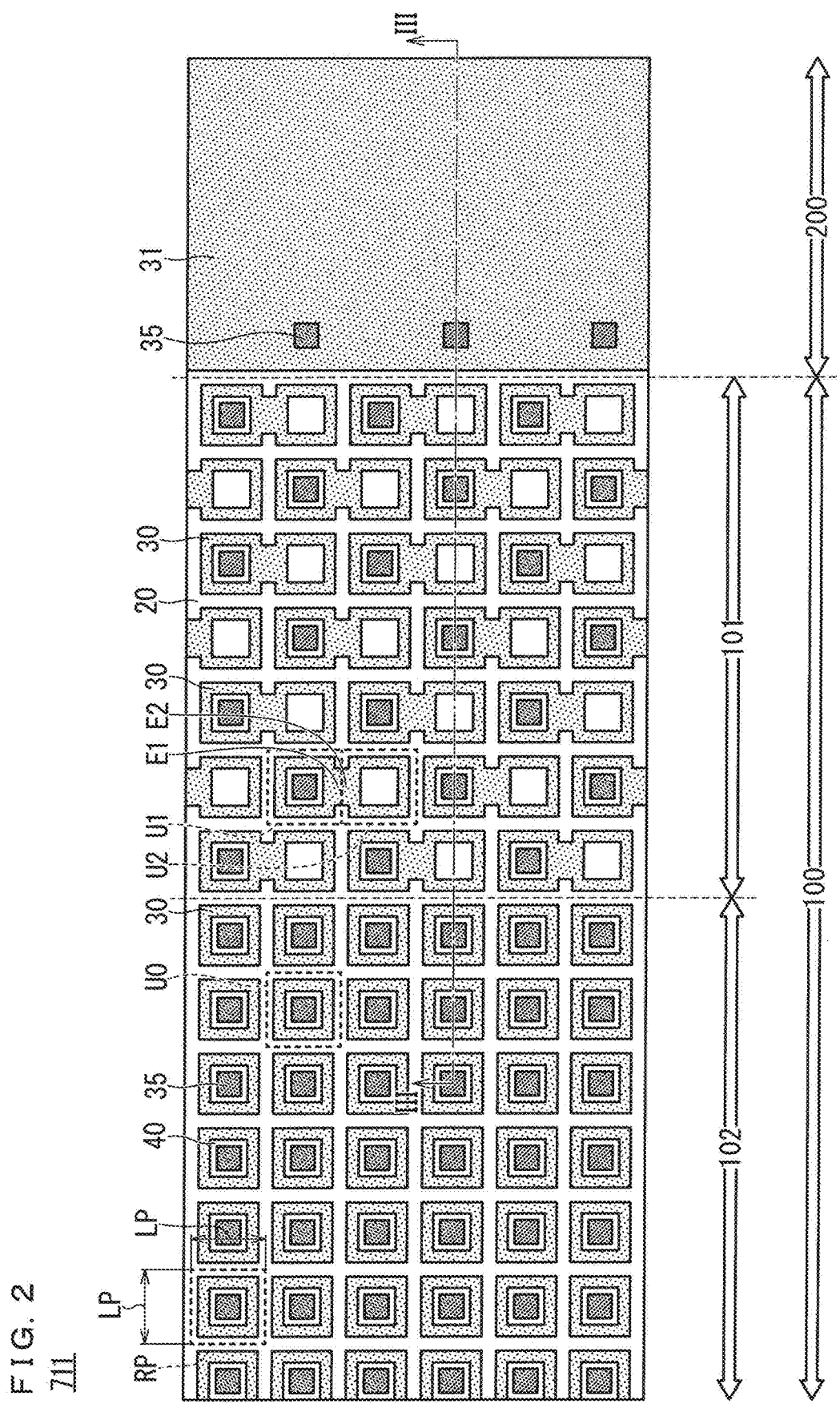
FIG. 2 is a partial top view schematically showing the configuration of a silicon carbide layer of the silicon carbide semiconductor device in an area II with dashed lines in FIG. 1.
Figure 3:
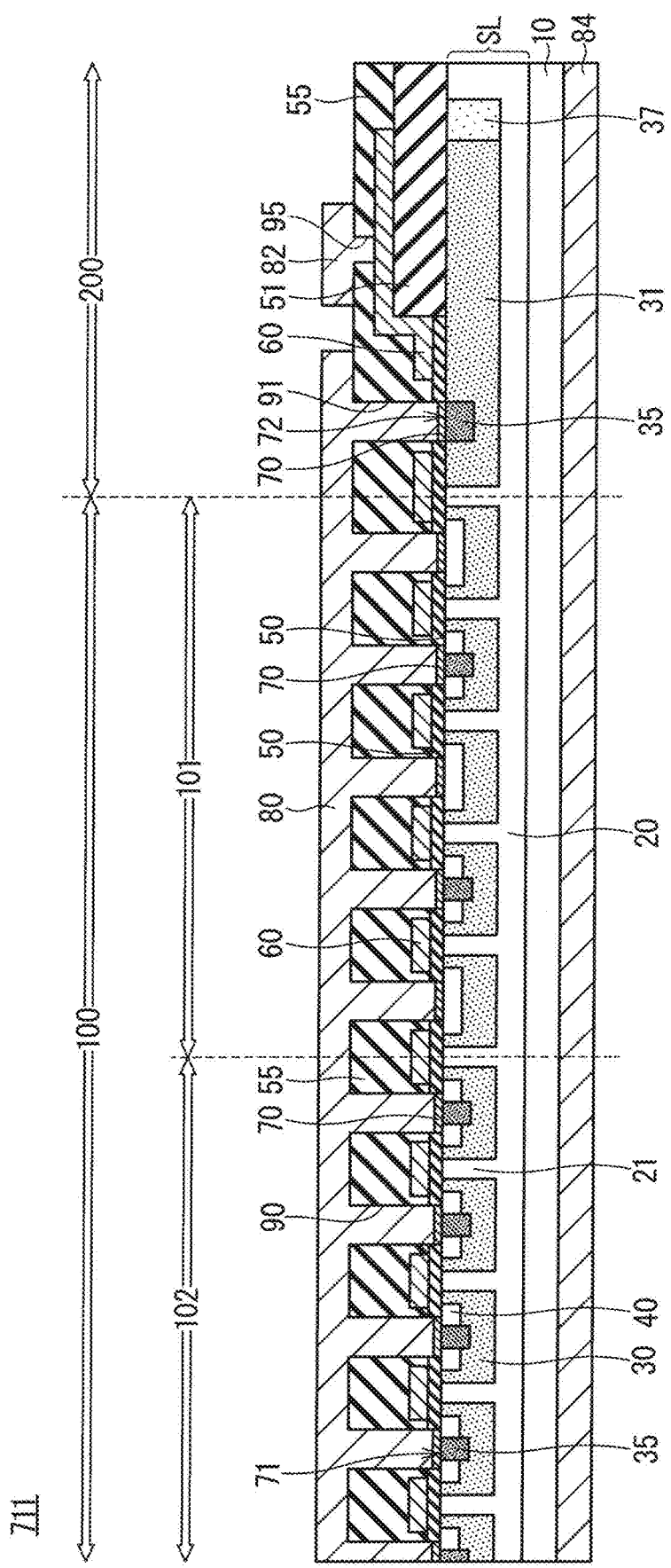
FIG. 3 is a partial sectional view schematically showing the configuration of the silicon carbide semiconductor device taken along a line in FIG. 2.

FIG. 2 is a partial top view schematically showing the configuration of a silicon carbide layer SL (FIG. 3) of the MOSFET 711 in an area II with dashed lines in FIG. 1. FIG. 3 is a partial sectional view schematically showing the configuration of the MOSFET 711 taken along a line in FIG. 2. The MOSFET 711 includes a silicon carbide substrate 10 (hereinafter also called an SiC substrate 10), the silicon carbide layer SL (hereinafter also called an SiC layer SL), a gate insulating film 50, a gate electrode 60, the gate pad 81, the source electrode 80, a plurality of ohmic electrodes 70, and a drain electrode 84.

The SiC substrate 10 has an n-type (first conductivity type). The SiC layer SL has a lower surface (first surface) facing the SiC substrate 10, and an upper layer (a second surface opposite the first surface in a thickness direction). The lower surface of the SiC layer SL may contact the SiC substrate 10.

The SiC layer SL has an active region 100 and an outer peripheral region 200 arranged along an outer periphery of the active region 100 in an in-plane direction vertical to the thickness direction. Typically, in the in-plane direction (in other words, in a plan view), the outer peripheral region 200 surrounds the active region 100. The active region 100 is directly responsible for a main function of the MOSFET 711, specifically, a current switching function. For this reason, an MOS gate structure of the MOSFET 711 is arranged in the active region 100, not in the outer peripheral region 200. The SiC layer SL includes a drift layer 20, a plurality of first well regions 30, a plurality of source regions 40, a second well region 31, a contact region 35, and a junction termination extension (JTE) region 37.

The drift layer 20 has the n-type. An impurity concentration in the drift layer 20 is lower than an impurity concentration in the SiC substrate. The drift layer 20 is arranged on the SiC substrate 10.

The first well regions 30 have the p-type (the second conductivity type different from the first conductivity type). The first well regions 30 are arranged on the drift layer 20 in the active region 100 and typically, form part of the upper surface of the SiC layer SL. The first well regions 30 are separated from each other at least in one sectional view (in a sectional view shown in FIG. 3, for example). The drift layer 20 has a JFET region 21 between two of the first well regions 30 adjacent to each other. An impurity concentration in the JFET region 21 forming part of the drift layer 20 may be equal to or different from an impurity concentration in the other part of the drift layer 20.

The source region 40 has the n-type. The source region 40 is arranged on the first well regions 30. The source region 40 is separated from the drift layer 20 by the first well regions 30. In particular, in the configuration shown in FIG. 3, an outer edge of each source region 40 is located internally to an outer edge of each first well region 30 at the upper surface of the SiC layer SL. By doing so, at the upper surface of the silicon carbide layer SL, each source region 40 is separated from the drift layer 20 by the first well region 30.

The contact region 35 has the p-type and has an impurity concentration higher than an impurity concentration in the first well region 30. The contact region 35 has an upper end reaching the upper surface of the SiC layer SL, and a lower end reaching the first well region 30. In the example shown in FIG. 2, the contact region 35 is surrounded by the source region 40 in a plan view.

The second well region 31 has the p-type. Typically, the second well region 31 forms part of the upper surface of the SiC layer SL. Typically, the second well region 31 is larger than each of the first well regions 30. The second well region 31 is arranged on the drift layer 20 in the outer peripheral region 200. More specifically, the second well region 31 is arranged externally to the first well region 30 at the outermost periphery across the JFET region 28. While the second well region 31 is separated from the first well region 30 in the first embodiment, the second well region 31 may be connected to the first well region 30 according to a modification (see FIG. 13, for example).

The ohmic electrodes 70 are arranged on the upper surface of the SiC layer SL. The ohmic electrode 70 in the active region 100 ohmically contacts the source region 40 and the contact region 35 reaching the first well region 30. The ohmic electrode 70 in the outer peripheral region 200 ohmically contacts the contact region 35 reaching the second well region 31. The contact with the contact region 35 forms electrical and ohmic contact of the ohmic electrodes 70 with the first well regions 30 and the second well region 31.

As described above, the ohmic electrodes 70 include a plurality of parts ohmically contacting a part (more specifically, the source region 40) forming the upper surface of the SiC layer and having the n-type, and a plurality of parts ohmically contacting a part (more specifically, the contact region 35) forming the upper surface of the SiC layer and having the p-type. In particular, the parts in the latter case will also be called a plurality of surface regions. According to this definition, each of the surface regions corresponds to a boundary surface between the part forming the upper surface of the SiC layer and having the p-type and the ohmic electrode 70.

The ohmic electrode 70 is made of a material selected so as to facilitate transfer of electrodes and holes to and from the source region 40 and the contact region 35 each having a relatively high impurity concentration. Typically, this material is a silicide alloy and may be a nickel silicide alloy, for example.

The gate insulating film 50 at least has a part facing the first well regions 30. In the example shown in FIG. 3, the gate insulating film 50 has a part straddling a boundary between the source region 40 and the first well region 30 and a part covering the first well region 30 between this boundary and the JFET region 21. The gate insulating film 50 may further have a part facing the second well region 31.

The gate electrode 60 has a part arranged over the active region 100 and facing the first well regions 30 across the gate insulating film 50, and a part arranged over the outer peripheral region 200 and insulated from the second well region 31. A surface layer of the first well region 30 facing the gate electrode 60 across the gate insulating film 50 functions as a channel region. The gate electrode 60 extends from the inside of the active region 100 into the outer peripheral region 200.

An interlayer insulating film 55 covers the gate electrode 60. In the outer peripheral region 200, while the gate electrode 60 is insulated from the second well region 31 by the gate insulating film 50 and a field insulating film 51, the gate electrode 60 is connected to the gate interconnect line 82 through a contact hole 95 in the interlayer insulating film 55.

The field insulating film 51 is provided over the outer peripheral region 200. The field insulating film 51 has a thickness greater than the thickness of the gate insulating film 50. While the field insulating film 51 is arranged only in the outer peripheral region 200 in the example shown in FIG. 3, the field insulating film 51 according to a modification may have a part extending from the outer peripheral region 200 into the active region 100. According to this modification, the field insulating film 51 may straddle the JFET region 21 and extend as far as to a position over part of the first well region 30.

The gate pad 81 (FIG. 1) and the gate interconnect line 82 (FIG. 1) are arranged over the second well region 31 (FIG. 3) and are insulated from the second well region 31. The gate pad 81 is connected to the gate electrode 60 through the gate interconnect line 82. The gate pad 81 and the gate interconnect line 82 are insulated from the second well region 31. In the configuration shown in FIG. 3, this insulation is ensured by the field insulating film 51. According to a modification, this insulation may be ensured by a different insulating film instead of the field insulating film 51, or by the different insulating film and the field insulating film 51. This different insulating film may be the gate insulating film 50, for example.

The source electrode 80 is provided over the upper surface of the SiC layer SL and is connected to each of the ohmic electrodes 70. This forms electrical and ohmic contact of the source electrode 80 with the source region 40 through the ohmic electrode 70 and forms electrical and ohmic contact of the source electrode 80 with the first well region 30 and the second well region 31 through the ohmic electrode 70 and the contact region 35. The source electrode 80 is insulated from the gate electrode 60 by the interlayer insulating film 55.

In the exemplary configuration shown in FIG. 3, a contact hole 90 penetrating the gate insulating film 50 and the interlayer insulating film 55 is formed on the ohmic electrode 70 connected to the first well region 30. The source electrode 80 passes through the contact hole 90 to reach the ohmic electrode 70 connected to the first well region 30. With this configuration, the first well region 30 is electrically and ohmically connected to the source electrode 80.

Furthermore, in the exemplary configuration shown in FIG. 3, a contact hole 91 penetrating the gate insulating film 50 and the interlayer insulating film 55 is formed on the ohmic electrode 70 connected to the second well region 31. The source electrode 80 passes through the contact hole 91 to reach the ohmic electrode 70 connected to the second well region 31. With this configuration, the second well region 31 is electrically and ohmically connected to the source electrode 80. In another configuration according to a modification, the second well region 31 may be electrically and ohmically connected to the source electrode 80. For example, if the second well region 31 and the first well region 30 are connected to each other at any place in a plan view, electrical and ohmic connection between the source electrode 80 and the second well region 31 can be established without forming the contact hole 91. In an applicable configuration according to another modification, the source electrode 80 and the second well region 31 may be capacitive connected to each other (see PCT International Publication No. 2018/155553 described above, for example). In this case, electrical and ohmic connection between the source electrode 80 and the second well region 31 is not required. In this case, during switching, a displacement current flows between the source electrode 80 and the second well region 31 through the capacitive connection.

The JTE region 37 is arranged on an outer peripheral side of the second well region 31 (on the opposite side of the first well region 30) on the drift layer 20. The JTE region 37 has the p-type and has an impurity concentration lower than an impurity concentration in the second well region 31.

The drain electrode 84 is provided on a back surface of the SiC substrate 10. The drain electrode 84 is electrically and ohmically connected to the SiC substrate 10. For obtaining the ohmic connection, a back surface ohmic electrode (not shown in the drawings) may be provided between the drain electrode 84 and the SiC substrate 10.

<1-2. Detail of Layout of Impurity Region in In-Plane Direction>

By referring to FIG. 2, the active region 100 includes a standard region part 102 and a thinned region part 101 between the standard region part 102 and the outer peripheral region 200. The thinned region part 101 is arranged next to the standard region part 102. The outer peripheral region 200 is arranged externally to the standard region part 102 across the thinned region part 101. Typically, the standard region part 102 making up a large proportion of the active region 100 is surrounded by the thinned region part 101, and the thinned region part 101 is surrounded by the outer peripheral region 200.

For the convenience of description given below, the active region 100 is divided into a plurality of periodic regions RP. In other words, for the convenience of description, it is considered that the active region 100 is configured by arranging the periodic regions RP periodically and repeatedly in several directions. In the example shown in FIG. 2, each of the periodic regions RP has a square shape with one side having a length LP, and the active region 100 is configured by arranging the periodic regions RP along the sides. Layout of an impurity region of each of the periodic regions RP will be described next.

In the standard region part 102, a unit cell U0 is provided in each of the periodic regions RP. Thus, the standard region part 102 is configured by arranging the unit cells U0 periodically. The unit cell U0 includes the first well region 30, the source region 40, and the contact region 35.

In the thinned region part 101, a unit cell U1 or a unit cell U2 is provided in each of the periodic regions RP. By the presence of both the unit cell U1 and the unit cell U2, the thinned region part 101 includes at least one unit cell U1 and at least one unit cell U2. Preferably, a pattern including both the unit cell U1 and the unit cell U2 is a periodic pattern. In the case of FIG. 2, for example, in each of an x direction (a lateral direction in the drawing) and a y direction (a vertical direction in the drawing), the unit cells U1 and the unit cells U2 are arranged alternately. The unit cells U1 and the unit cells U2 each include the first well region 30 and the source region 40. The unit cell U1 further includes the contact region 35, like the unit cell U0. On the other hand, the unit cell U2 does not include the contact region 35. Outer edge patterns of the source regions 40 in the unit cells U0 to U2 may be common to each other.

The first well region 30 in the unit cell U2 is connected to the first well region 30 in the unit cell U1 directly or indirectly through the first well region 30 in another unit cell U2. In particular, in the example shown in FIG. 2, the first well region 30 in the unit cell U2 is directly connected to the first well region 30 in the unit cell U1. This connection avoids the occurrence of a floating state of the first well region 30 in the unit cell U2. In order to form this connection, the first well region 30 in at least one of the unit cell U1 and the unit cell U2 may have an extension of extending the shape of the first well region 30 in the unit cell U0. In particular, in the example shown in FIG. 2, the first well region 30 in the unit cell U1 and the first well region 30 in the unit cell U2 include an extension E1 and an extension E2 respectively. Each of the extension E1 and the extension E2 is connected to the first well region 30 in the adjoining periodic region RP. In particular, in the example shown in FIG. 2, the extension E1 and the extension E2 are connected to each other.

In the standard region part 102, the shapes of the first well regions 30 are polygonal shapes arranged repeatedly in the in-plane direction. In the example shown in FIG. 2, these shapes are square shapes arranged repeatedly in the x direction and the y direction. Furthermore, putting aside the extension E1 and the extension E2, the shapes of the first well regions 30 in the thinned region part 101 are also polygonal shapes arranged repeatedly in the in-plane direction. In other words, putting aside the extension E1 and the extension E2, the shapes of the first well regions 30 are polygonal shapes arranged repeatedly in the in-plane direction in the active region 100 entirely including the standard region part 102 and the thinned region part 101. In particular, in the example shown in FIG. 2, these shapes are square shapes arranged repeatedly in the x direction and the y direction.

On the other hand, the description given above based on the division into the periodic regions RP is not applied to the outer peripheral region 200. In the outer peripheral region 200, the second well region 31 larger than each first well region 30 in the standard region part 102 is provided. In particular, in the example shown in FIG. 2, two or more contact regions 35 are arranged periodically on the second well region 31.

In the case described above in detail, each of the first well regions 30 in the standard region part 102 has a square shape. The square shape may be replaced with a rectangular shape having long sides and short sides or with a different polygonal shape.

Figure 4:
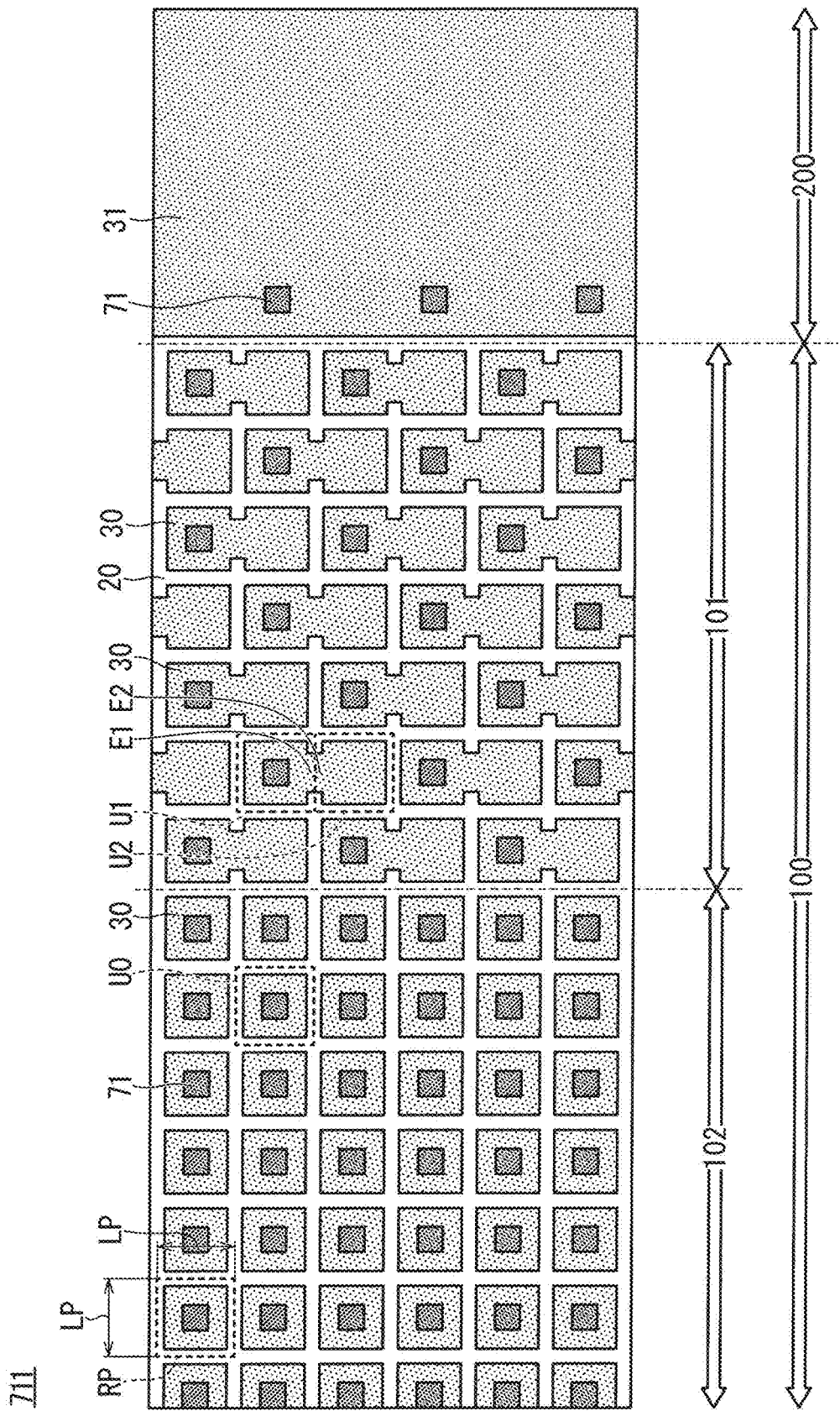
FIG. 4 is a partial top view schematically showing a first well region, a second well region, and a plurality of surface regions where part of an upper surface of the silicon carbide layer having a second conductivity type and a plurality of ohmic electrodes ohmically contact each other in the field of view of FIG. 2.

FIG. 4 is a partial top view schematically showing the first well region 30, the second well region 31, and the surface region 71 in the field of view of FIG. 2. The source region 40 (FIG. 2) is not shown in FIG. 4. Here, the surface region 71 is defined as a region where part of the upper surface of the SiC layer SL (FIG. 3) having the p-type and the ohmic electrode 70 (FIG. 3) ohmically contact each other. As shown in FIG. 4, the surface density of the surface regions 71 in a plan view is lower in the thinned region part 101 than in the standard region part 102.

Figure 5:
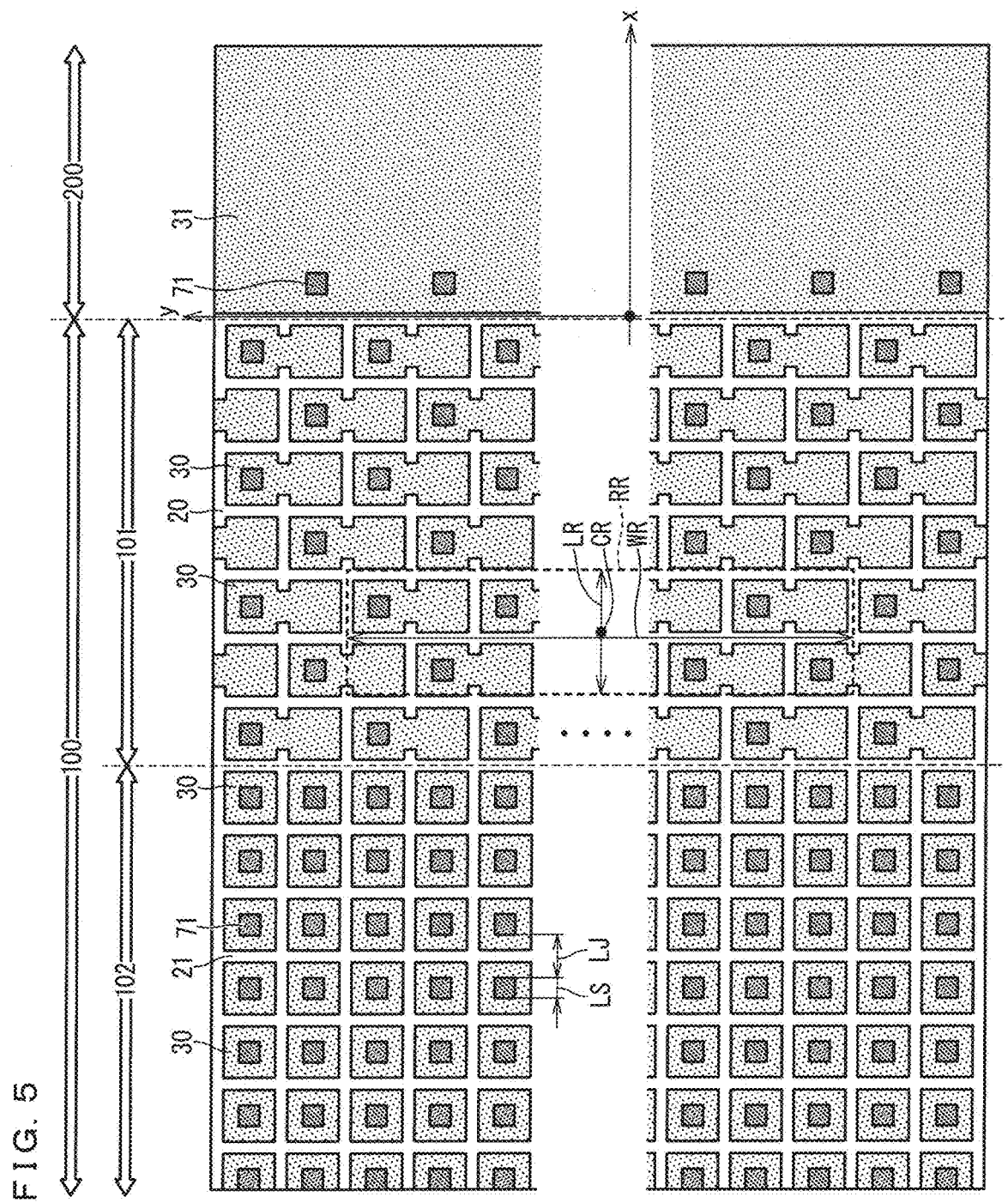
FIG. 5 is a partial top view explaining definition of the surface density of the surface regions in the field of view of FIG. 2 enlarged in a vertical direction.

FIG. 5 shows the field of view of FIG. 4 in a manner enlarged in the vertical direction (y direction). The definition of the above-described surface density will be described in detail by referring to this drawing. In the drawing, the y direction extends along a boundary line between the active region 100 and the outer peripheral region 200, and the x direction is vertical to the y direction. In FIG. 5, a rectangular region RR has a length LR in the x direction, a width WR in the y direction, and a center position CR. A value obtained by dividing the area of the surface regions 71 in the rectangular region RR by the area of the rectangular region RR is defined as surface density at the position CR. The length LR is an integral multiple of the length LP (FIG. 2) corresponding to the period of the periodic region RP, more specifically, is a length equal to or greater than twice the length LP and sufficiently smaller than an entire length (a dimension in the x direction) of the SiC layer SL. Also, the width WR is an integral multiple of the length LP (FIG. 2) corresponding to the period of the periodic region RP, more specifically, is a length equal to or greater than 10 times the length LP and sufficiently smaller than an entire width (a dimension in the y direction) of the SiC layer SL. While the periods of the periodic regions RP are common to each other in both the x direction and the y direction in the above-described case, these periods may differ from each other.

As described above, the surface density of the surface regions 71 in a plan view is lower in the thinned region part 101 than in the standard region part 102. The following explains an exemplary method of judging whether a distribution of the surface density fulfills this condition.

Figure 6:
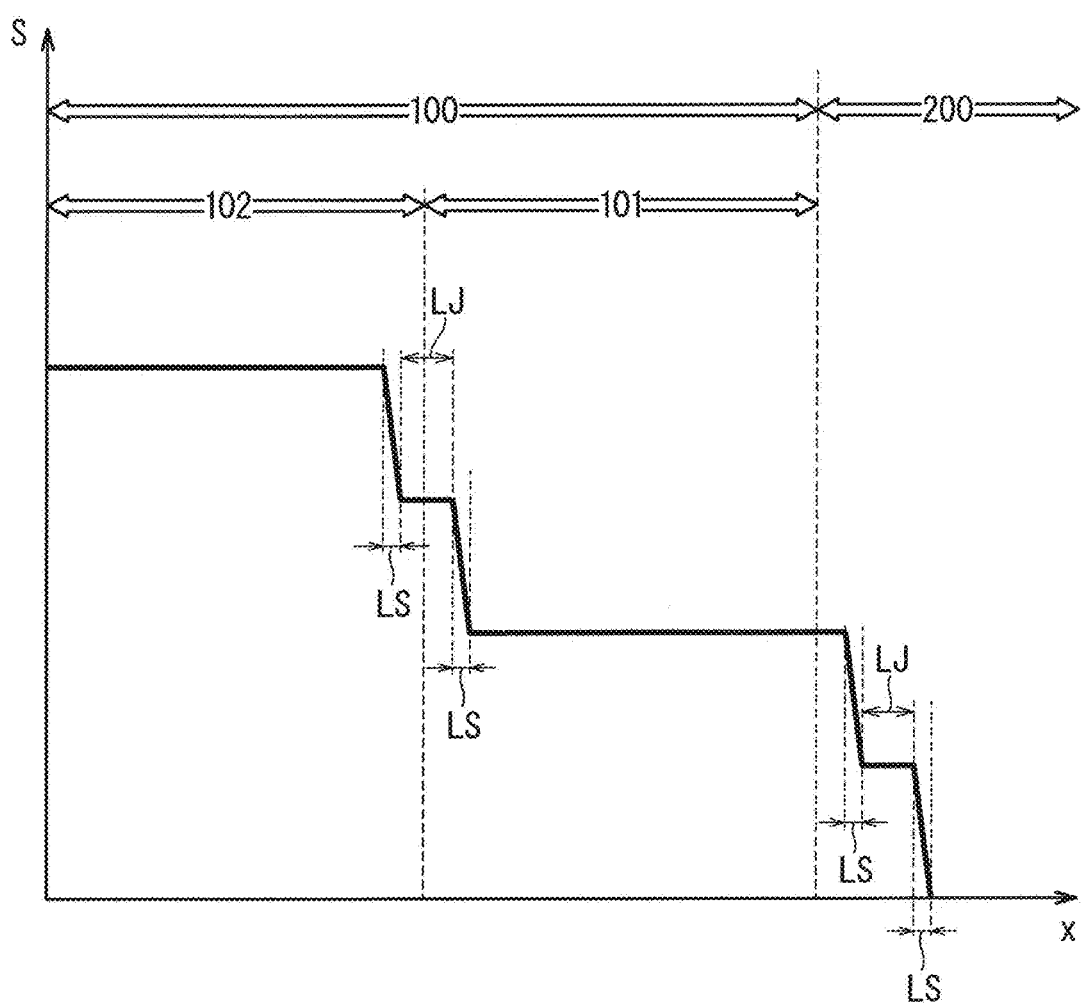
FIG. 6 is a graph showing a distribution of the surface density defined in FIG. 5 in an x-axis direction.

In the case of a quadrangular chip such as that shown in FIG. 1, surface density is calculated in a region sufficiently separated from the four corners of the chip. In other words, the center position CR (FIG. 5) is set at a position within a region sufficiently separated from the four corners of the chip. The length LR (FIG. 5) is 10 times the length LP (FIG. 2) and the width WR (FIG. 5) is twice the length LR. FIG. 6 shows a relationship between an x coordinate of the center position CR and surface density S while a y coordinate of the center position CR is constant. Referring to FIG. 6, putting aside a boundary between the standard region part 102 and the thinned region part 101 and its vicinity, the surface density S in the thinned region part 101 is lower than (more specifically, about half of) the surface density S in the standard region part 102, thereby fulfilling the foregoing condition. Also, irrespective of whether to put aside the boundary and its vicinity like in the above-described case, the average surface density S in the thinned region part 101 is lower than (more specifically, about half of) the average surface density S in the standard region part 102, thereby fulfilling the foregoing condition.

<1-3. Manufacturing Method>

An example of a method of manufacturing the MOSFET 711 will be described next.

Referring to FIG. 3, the SiC substrate 10 made of n-type and low-resistance silicon carbide having 4H polytype is prepared first. A plane direction of the upper surface of the SiC substrate 10 has a slight off-angle from a plane (0001). Next, the SiC layer SL having a thickness from 5 to 200 μm and having the n-type is formed by epitaxial growth on the upper surface of the SiC substrate 10 using a chemical vapor deposition method (CVD method). The concentration of the n-type impurity (donor concentration) is from $1\times10^{14}$ to $1\times10^{17}$ cm$^{-3}$, for example. Part of the SiC layer SL formed in this way other than part to be reversed in conductivity type by ion implantation described later functions as the drift layer 20 for the MOSFET 711.

Then, an implantation mask is formed on the upper surface of the SiC layer SL using a photoresist, for example. Using this implantation mask, Al (aluminum) as p-type impurity (acceptor) is added by ion implantation into the upper surface of the SiC layer SL. This ion implantation is performed to a depth that does not exceed the thickness of the SiC layer SL and is from about 0.3 to about 3 μm, for example. The concentration of the Al doping is higher than the impurity concentration in the drift layer 20 and is from $1\times10^{17}$ to $1\times10^{19}$ cm$^{-3}$, for example. Then, the implantation mask is removed. Regions given the p-type by the addition of Al in this step function as the first well region 30 and the second well region 31.

Some additional layer may be provided on the upper surface of the SiC substrate 10 before formation of the SiC layer SL. In this case, this additional layer is considered as part of the SiC substrate 10. For example, the additional layer to be formed may be an n-type buffer layer of a higher concentration than the drift layer 20. The n-type buffer layer allows recombination of minority carriers getting into the SiC substrate 10 from the inside of the drift layer 20. As an alternative to or in addition to the n-type buffer layer, a conversion layer for converting BPD existing at the surface of the SiC substrate 10 to threading edge dislocation may be formed as an additional layer by epitaxial growth.

Next, an implantation mask is formed on the upper surface of the SiC layer SL using a photoresist, for example. Using this implantation mask, Al as p-type impurity is added by ion implantation into the upper surface of the SiC layer SL. This ion implantation is performed to a depth that does not exceed the thickness of the SiC layer SL and is in a range from about 0.3 to about 3 μm, for example. The concentration of the Al doping is higher than the impurity concentration in the drift layer 20 and lower than the impurity concentration in the second well region 31 and is in a range from $1\times10^{16}$ to $1\times10^{18}$ cm$^{-3}$, for example. Then, the implantation mask is removed. A region given the p-type by the addition of Al in this step function as the JTE region 37. Likewise, Al is ion-implanted into a predetermined region of the surface of the first well region 30 to an impurity concentration higher than the impurity concentration in the first well region 30, thereby forming the contact region 35.

Then, an implantation mask is formed on the upper surface of the SiC layer SL using a photoresist, for example, in such a manner as to expose a predetermined place internal to an outer edge of the first well region 30. Using this implantation mask, N (nitrogen) as n-type impurity (donor) is added by ion implantation into the upper surface of the SiC layer SL. This ion implantation is performed to a depth less than the thickness of the first well region 30. The concentration of the N doping exceeds the p-type impurity concentration in the first well region 30 and is in a range from $1\times10^{18}$ to $1\times10^{21}$ cm$^{-3}$, for example. A region given the n-type by the addition of N in this step functions as the source region 40.

Next, in an atmosphere of an inert gas such as argon (Ar) gas, a thermal processing device performs annealing at a temperature from 1300 to 1900° for a duration from 30 seconds to one hour. As a result of this annealing, the N and Al added by the ion implantations are electrically activated.

Then, using a CVD method or photolithography technique, for example, the field insulating film 51 made of silicon oxide having a thickness from 0.3 to 2 μm is formed on the SiC layer SL in part of the outer peripheral region 200. Next, part of the upper surface of the SiC layer SL not covered with the field insulating film 51 is thermally oxidized to form a silicon oxide film as the gate insulating film 50. Then, a polycrystalline silicon film having conductivity is formed by a low-pressure CVD method on the gate insulating film 50 and the field insulating film 51. The polycrystalline silicon film is patterned to form the gate electrode 60. Next, the interlayer insulating film 55 made of silicon oxide is formed by a low-pressure CVD method. The contact hole 90 is thereafter formed in such a manner as to penetrate the interlayer insulating film 55 and the gate insulating film 50 to reach the contact region 35 and the source region 40 in the active region 100. Likewise, the contact hole 91 is formed in such a manner as to reach the second well region 31.

Next, a metal film containing Ni as a main constituent is formed by a sputtering method, for example. Then, thermal process is performed in a temperature from 600 to 1100° C. to cause reaction between Ni atoms in the metal film and Si atoms in the SiC layer SL inside the contact hole 90 and inside the contact hole 91, thereby forming a silicide layer functioning as the ohmic electrode 70 between the SiC layer SL and the metal film. Then, part of the metal film not having been changed to the silicide layer is removed by wet etching.

A metal film containing Ni as a main constituent is thereafter formed on the back surface of the SiC substrate 10. This metal film is thermally processed to form a back surface ohmic electrode (not shown in the drawings).

Next, the contact hole 95 is formed by etching using a mask such as a photoresist, for example, in such a manner as to penetrate the interlayer insulating film 55.

Then, film deposition using a method such as sputtering and patterning by a method such as photolithography are performed to form part of the source electrode 80 on the ohmic electrode 70 in the contact hole 90 and in the contact hole 91.

Next, on the upper surface side of the SiC substrate 10, metal for interconnection such as Al is deposited by a sputtering method or a vapor deposition method and patterning is performed by a method such as photolithography to form the remaining part of the source electrode 80, the gate pad 81, and the gate interconnect line 82.

Next, the drain electrode 84 is formed on a surface of the back surface ohmic electrode (not shown in the drawings) formed on the back surface of the SiC substrate 10. As a result of the foregoing, the MOSFET 711 is completed.

<1-4. Operation>

The following describes the operation of the MOSFET 711, in particular, the free-wheeling operation of the MOSFET 711 in an exemplary case where an SiC material of the SiC layer SL has polytype 4H. A diffusion potential at a pn junction in the SiC having the polytype 4H is about 2 V.

If the MOSFET 711 is used as a switching element in a power conversion system according to a third embodiment described later, for example, a state in a channel region in the MOSFET 711 is switched between an ON state and an OFF state. In the OFF state, a drain voltage (a voltage at the drain electrode 84) becomes lower than a source voltage (a voltage at the source electrode 80) in a certain period and the drain voltage in this period is from several voltages to several tens of volts below zero, for example. The MOSFET 711 performs the free-wheeling operation in this period.

More specifically, a forward voltage exceeding 2 V corresponding to the diffusion potential is applied to a pn junction formed between each of the first well region 30 and the second well region 31 ohmically connected to the source electrode 80 and the drift layer 20 ohmically connected to the drain electrode 84. Specifically, a voltage exceeding a forward voltage is applied to a body diode of the MOSFET 711. As a result, the MOSFET 711 operates as a free-wheeling diode. This causes a large bipolar current to flow in a direction from the source electrode 80 toward the drain electrode 84. If current density of this current is equal to or greater than 100 A/cm$^2$, significant conductivity modulation is generated in the drift layer 20. Specifically, holes in large quantity flow into the drift layer 20 to accumulate the holes in the drift layer. Then, electrons are electrically attracted by these holes. By doing so, like the holes, the electrons of a concentration higher than a concentration at the time of a thermal equilibrium state are accumulated in the drift layer 20. As a result, resistivity in the drift layer 20 is reduced to a level substantially equal to a resistance value in the SiC substrate 10, which has a low resistance.

Operation except the free-wheeling operation will not be described as it is substantially the same as that of a normal MOSFET.

<1-5. Simulation>

If a distribution of the surface density S (FIG. 6) is not optimized, current density is increased locally at a place such as the vicinity of a boundary between the active region 100 and the outer peripheral region 200 during the above-described free-wheeling operation. On the other hand, optimizing a distribution of the surface density S (FIG. 6) like in the present embodiment makes it possible to suppress this increase. The following describes two-dimensional T-CAD simulation conducted to explain this suppression by generating a model of a body diode included in a vertical MOSFET.

Figure 7:
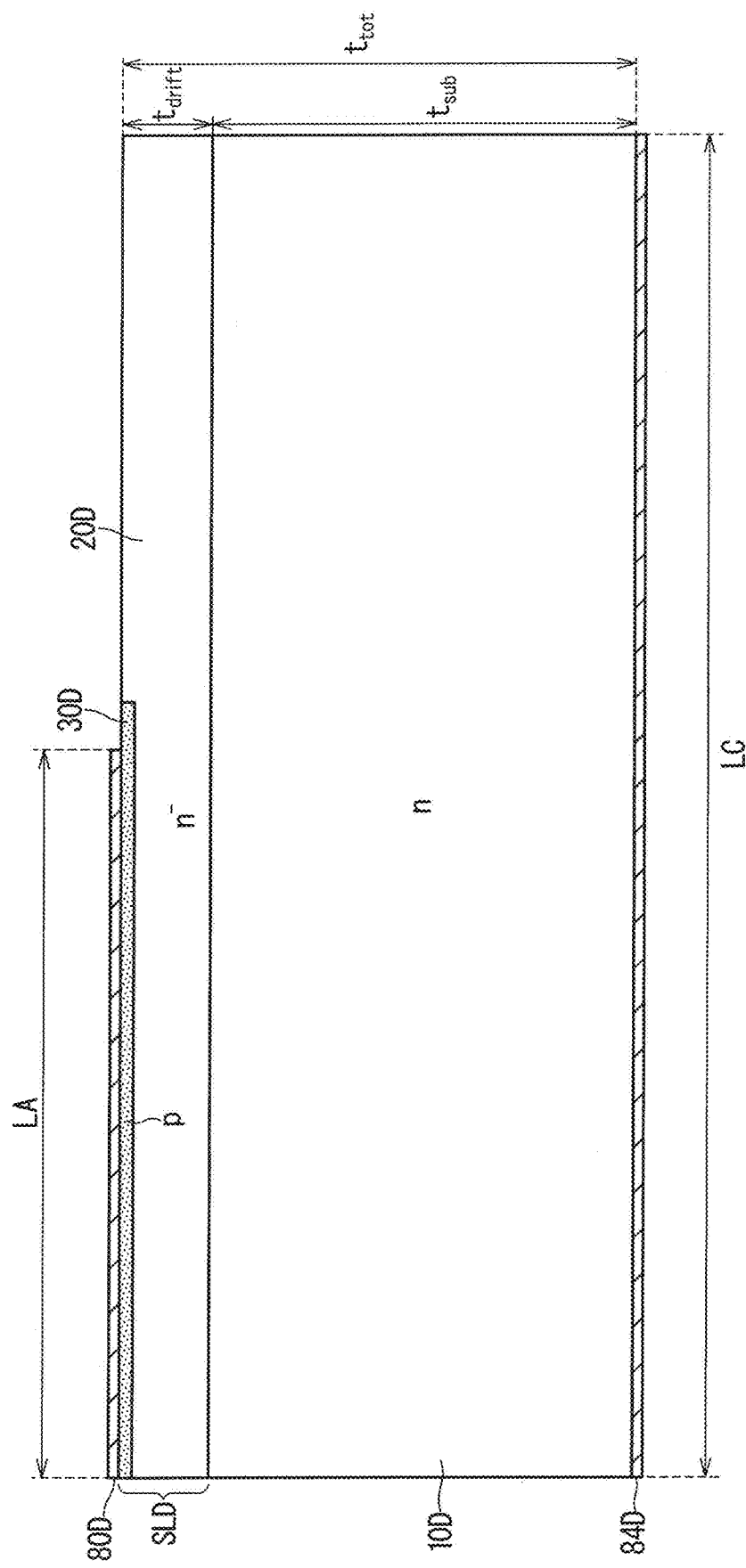
FIG. 7 is a sectional view corresponding to a comparative example showing the configuration of a pn diode used in simulation about a current density distribution (FIGS. 8 and 9) and a hole concentration distribution (FIG. 10) during free-wheeling operation.

FIG. 7 is a sectional view showing a model of a body diode according to a comparative example in which the surface density S (FIG. 6) is substantially uniform in the active region 100 (FIG. 3). A cathode electrode 84D, an SiC substrate 10D, an SiC layer SLD, and an anode electrode 80D are defined as models of the drain electrode 84, the SiC substrate 10, the SiC layer SL, and the source electrode 80 in the MOSFET 711 (FIG. 3) respectively. The SiC layer SLD includes a drift layer 20D as a model of the drift layer 20 (FIG. 3) and a well region 30D as a model of each of the first well region 30 and the second well region 31 (FIG. 3). The SiC substrate 10D has a thickness $t_{sub}$ and the drift layer 20D has a thickness $t_{drift}$, and a total of these thicknesses is a thickness $t_{tot}$. As viewed in an in-plane direction (a lateral direction in FIG. 7), a left end of the model in FIG. 7 corresponds to a center position of the active region 100 (FIG. 3). An electrode width LA is a dimension from this center position to an outer edge of the anode electrode 80D. An electrode width LC is a dimension from this center position to an outer edge of the cathode electrode 84D. In FIG. 7, dimensions in a vertical direction are illustrated in an exaggerated manner to improve the visualization of the drawing. In terms of actual dimensions, the electrode width LA and the electrode width LC are considerably greater than the thickness $t_{tot}$.

Figure 8:
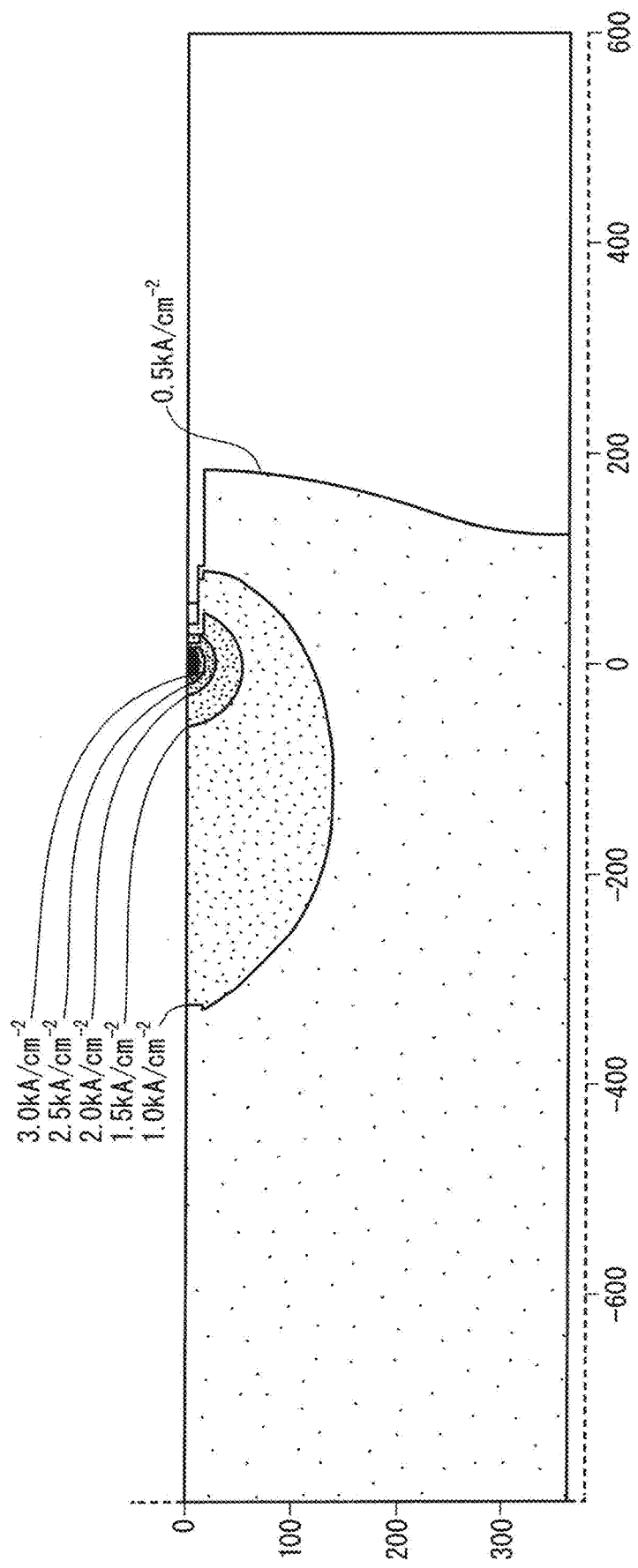
FIG. 8 is a distribution map corresponding to the comparative example showing result of the simulation about the current density distribution using the configuration of the pn diode shown in FIG. 7.

FIG. 8 is a distribution map showing result of simulation about current density in the vicinity of an end portion of the anode electrode 80D conducted by applying a current corresponding to 1000 A per unit area of the anode electrode 80D to a center position (a left end position in FIG. 7) of the anode electrode 80D (FIG. 7). As a result of this simulation, a region of extremely high current density is observed in an oval shape with respect to an end portion of the anode electrode 80D as a center.

Figure 9:
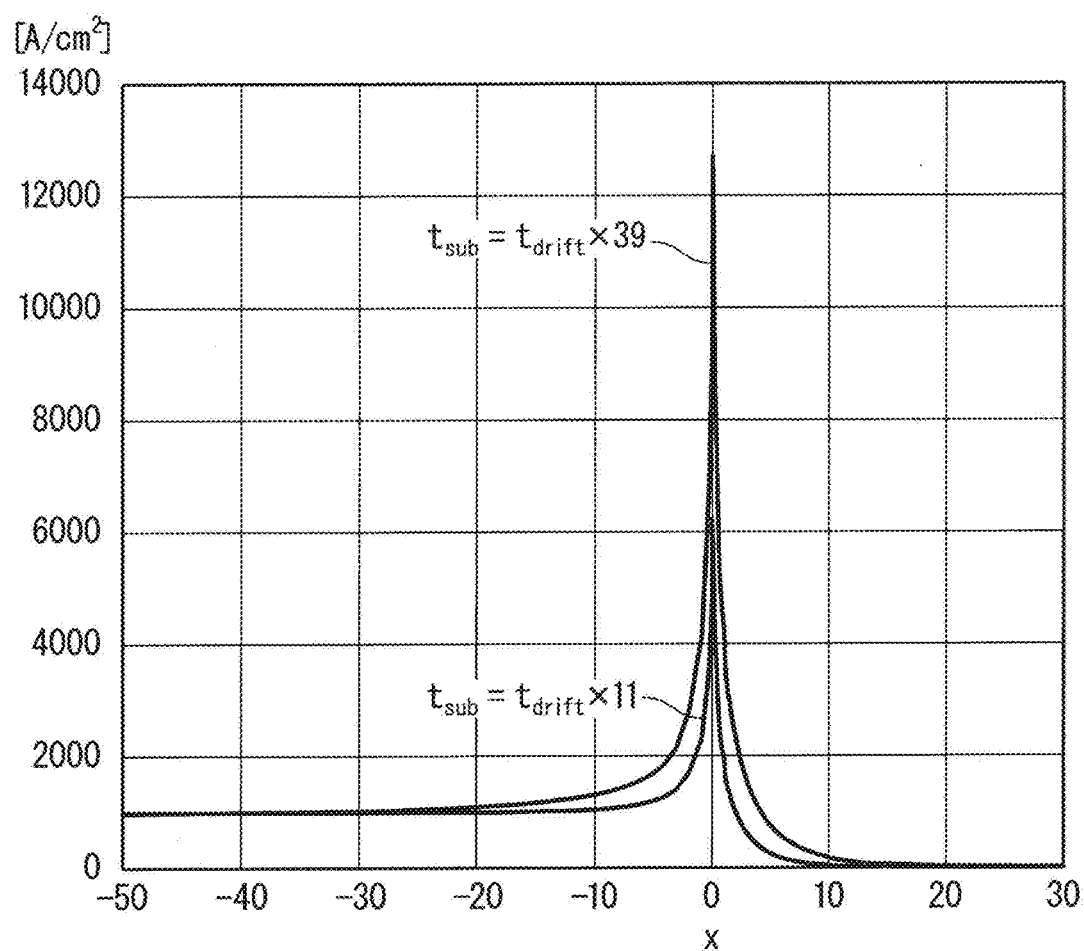
FIG. 9 is a graph corresponding to the comparative example showing result of the simulation along a bottom surface of a well region conducted on the current density distribution using two types of substrate thicknesses in the configuration of the pn diode shown in FIG. 7.

FIG. 9 is a graph showing current density along a bottom surface of the well region 30D (FIG. 7) obtained by conducting simulation similar to that described above under two conditions in a case where $t_{sub}=t_{drift}\times 39$ and in a case where $t_{sub}=t_{drift}\times 11$. Under each of these conditions, current density is maximum at an end position of the anode electrode 80D (a position where x=0 in FIG. 9). As the thickness $t_{sub}$ of the SiC substrate 10D becomes greater, a peak value and a peak width of the current density become greater. This shows that the thickness $t_{sub}$ of the SiC substrate 10D has influence on a state of current concentration.

Referring back to FIG. 8, it can be seen that extension of a current in the drift layer 20D and extension of a current in the SiC substrate 10D are substantially continuous with each other. A possible reason for this is that resistivity in the drift layer 20D is reduced by conductivity modulation to a level substantially corresponding to resistivity in the SiC substrate 10D. Thus, the thickness $t_{tot}$ of a resistance element covering both the SiC substrate 10D and the drift layer 20D is considered to have more direct correlation with a current density distribution than either the thickness $t_{sub}$ of the SiC substrate 10D or the thickness $t_{drift}$ of the drift layer 20D.

Analysis conducted on the simulation result in FIG. 9 shows that, under both of the conditions defining two types of thicknesses, a position where current density is high by 10% relative to current density around the center of the anode electrode 80D (current density closer to the left end in the graph of FIG. 9) is a position separated in an inward direction (a leftward direction in FIG. 9) from the end position of the anode electrode 80D (the position where x=0 in FIG. 9) by a distance corresponding to 60% of the thickness $t_{tot}$. A position where current density is high by 30% relative to the current density around the center of the anode electrode 80D is a position separated in the inward direction from the end position of the anode electrode 80D by a distance corresponding to 30% of the thickness $t_{tot}$. Furthermore, a position where current density is high by 50% relative to the current density around the center of the anode electrode 80D is a position separated in the inward direction from the end position of the anode electrode 80D by a distance corresponding to 20% of the thickness $t_{tot}$. This analysis shows that the width (a dimension in the x direction) of the thinned region part 101 (FIG. 2) is preferably equal to or greater than 20% of a sum of the thickness of the SiC substrate 10 (FIG. 3) and the thickness of the SiC layer SL (FIG. 3), more preferably, equal to or greater than 30%, still more preferably, equal to or greater than 50% of this sum.

Figure 10:
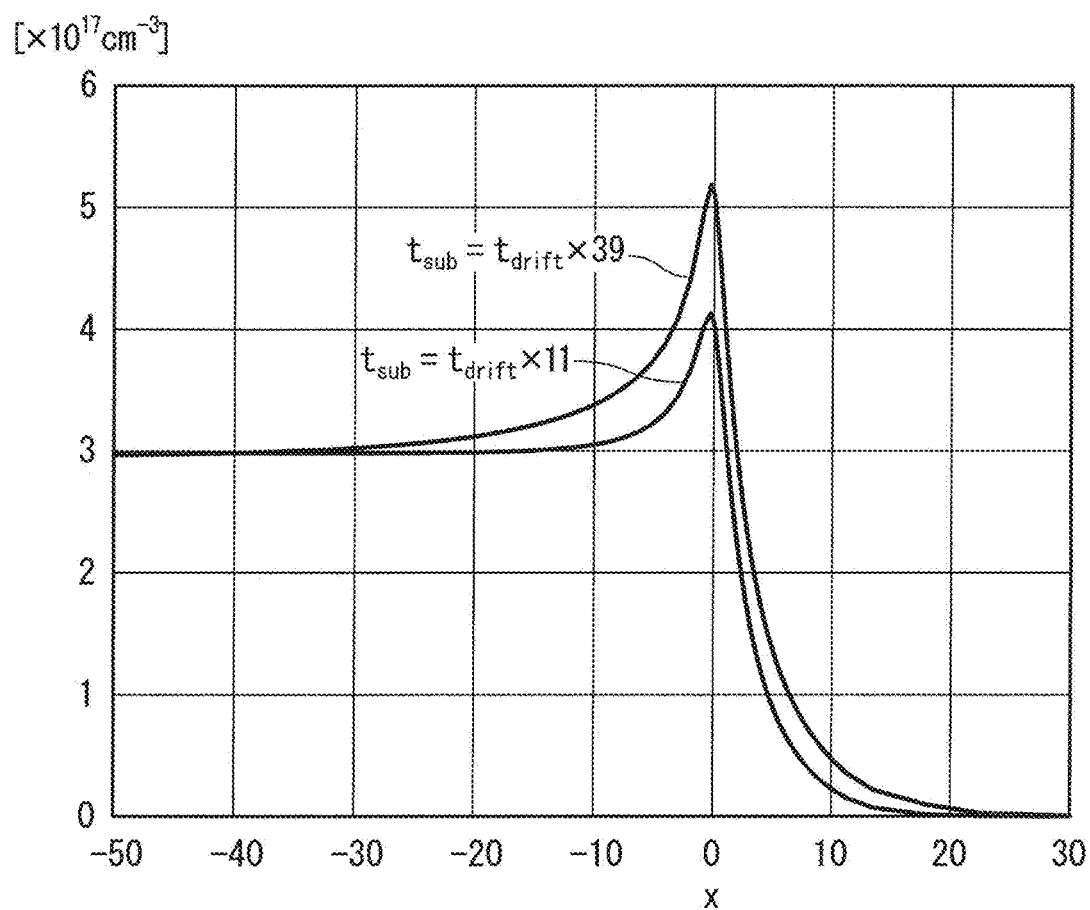
FIG. 10 is a graph corresponding to the comparative example showing result of the simulation at a depth position on a bottom surface of a drift layer conducted on the hole concentration distribution using two types of substrate thicknesses in the configuration of the pn diode shown in FIG. 7.

FIG. 10 is a graph showing result of simulation about a hole concentration distribution conducted under conditions similar to those of FIG. 9. A distribution similar to the current density distribution (FIG. 9) is observed as the hole concentration distribution. Thus, employing a configuration of relaxing current density concentration is considered to achieve suppression of local increase also in a hole concentration. This is considered to achieve provision of a silicon carbide semiconductor device of high reliability through suppression of characteristic degradation of the body diode.

Expanding the thinned region part 101 as far as to a region substantially free from increase in a hole concentration may cause additional increase in a hole concentration inside the thinned region part 101. Thus, it is assumed that the above-described effect is achieved more reliably by setting the width of the thinned region part 101 in such a manner as to prevent such additional increase. Analysis conducted on the simulation result in FIG. 10 shows that a position where a hole concentration is high by 1% relative to a hole concentration around the center of the anode electrode 80D (a hole concentration closer to the left end in the graph of FIG. 10) is a position separated in an inward direction (a leftward direction in FIG. 10) from an end position of the anode electrode 80D (a position where x=0 in FIG. 10) by a distance corresponding to 110% of the thickness $t_{tot}$. A position where a hole concentration is high by 3% relative to the hole concentration around the center of the anode electrode 80D is a position separated in the inward direction from the end position of the anode electrode 80D by a distance corresponding to 70% of the thickness $t_{tot}$. It is assumed from this analysis that the width (a dimension in the x direction) of the thinned region part 101 (FIG. 2) is preferably equal to or less than 110% of a sum of the thickness of the SiC substrate 10 (FIG. 3) and the thickness of the SiC layer SL (FIG. 3), more preferably, equal to or less than 70%.

Figure 11:
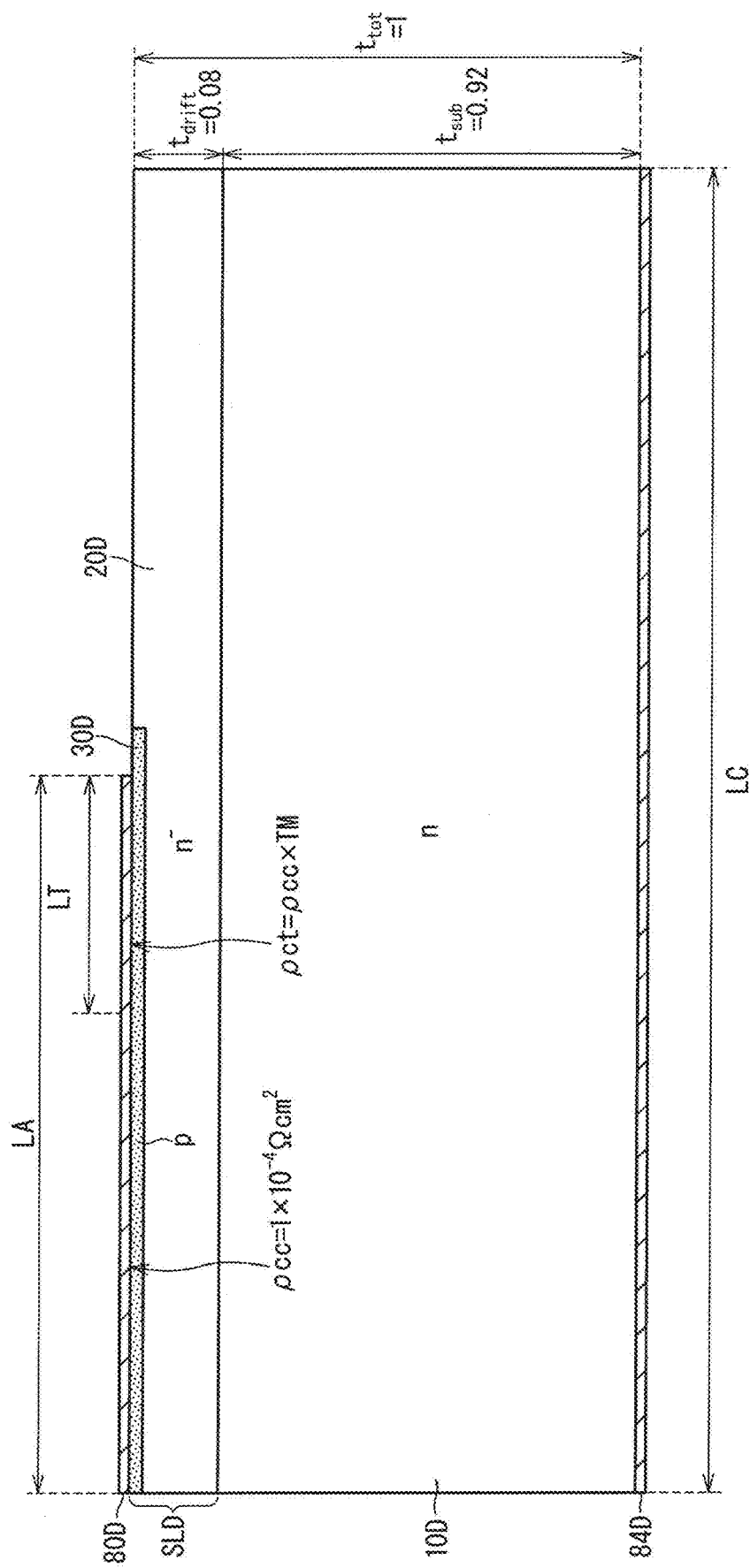
FIG. 11 is a sectional view showing the configuration of a pn diode used in simulation about a hole concentration distribution (FIG. 12) during free-wheeling operation conducted by changing a surface density distribution.

FIG. 11 is a sectional view showing a model of a body diode generated by giving consideration to a difference in the surface density S (FIG. 6) in the active region 100 (FIG. 3). This model differs from the above-described model in FIG. 7 in that, in order to generate a model of the difference in the surface density S in the active region, contact resistivity is defined at a boundary between the anode electrode 80D and the well region 30D. More specifically, this boundary has contact resistivity of $\rho cc=1\times10^4$ ($\Omega \cdot cm^2$) in a range of a width LT corresponding to the thinned region part 101 (FIG. 3) and has contact resistivity of $\rho ct = \rho cc \times TM$ ($\Omega \cdot cm^2$) (TM is a coefficient) in a range corresponding to the standard region part 102 (FIG. 3). In the model of FIG. 11, the thickness $t_{tot}$ is a unit dimension. In other words, $t_{tot}=1$. Furthermore, $t_{drift}=0.08$, $t_{sub}=0.92$, LA=39, and LT=0.88.

Figure 12:
FIG. 12 is a graph showing result of the simulation at a depth position on a bottom surface of a drift layer conducted on the hole concentration distribution using different surface density distributions in the configuration of the pn diode shown in FIG. 11.

FIG. 12 is a distribution map showing result of simulation about a hole concentration distribution in the vicinity of an end portion of the anode electrode 80D conducted by applying a current corresponding to 1000 A per unit area of the anode electrode 80D to a center position (a left end position in FIG. 11) of the anode electrode 80D (FIG. 11). In conducting the simulation, to examine dependency on a value of $\rho ct = \rho cc \times TM$ (FIG. 11), TM is set to 1.0, 1.2, 1.5, 2.0, 5.0, 10.0, 20.0, and 50.0.

Result of this simulation shows that setting $\rho ct$ to a value equal to or greater than 1.5 times a value of $\rho cc$ reduces a hole concentration peak significantly in the vicinity of a position where x=0. In applying this feature to the MOSFET 711 (FIG. 4), it is preferable that average contact resistivity in the thinned region part 101 be equal to or greater than 1.5 times average contact resistivity in the standard region part 102. As contact resistivity is considered to be substantially constant in the surface regions 71, the surface density of the surface regions 71 is required to be changed for changing a distribution of the average contact resistivity. To achieve the distribution of the average contact resistivity described above, the surface density of the surface regions 71 in the thinned region part 101 is preferably equal to or less than ⅔ of the surface density of the surface regions 71 in the standard region part 102.

If a value of the coefficient TM exceeds 1, an additional peak of a hole concentration appears at a position closer to the center (in the vicinity of a position where x=−1 in the graph of FIG. 12). A value of this peak with the coefficient TM of equal to or greater than 20 becomes close to a value substantially equal to a peak value in the vicinity of a position of x=0 while TM is 1. In view of this, in order to avoid adverse influence resulting from increase in a hole concentration at the position of the foregoing additional peak, the coefficient TM is preferably equal to or less than 10. In response to this, the surface density of the surface regions 71 in the thinned region part 101 is preferably equal to or greater than ¹⁄₁₀ of the surface density of the surface regions 71 in the standard region part 102.

<1.6 Effects>

According to the present embodiment, the surface density S (FIG. 6) of the surface regions 71 in a plan view (FIG. 4) is lower in the thinned region part 101 than in the standard region part 102. Such a surface density distribution is obtainable without involving a particularly complicated manufacturing method, so that considerable increase in manufacturing cost does not occur. The surface density S of the surface regions 71 lower in the thinned region part 101 than in the standard region part 102 suppresses local increase in a bipolar current occurring in a local region in the vicinity of the boundary between the outer peripheral region 200 and the active region 100. This achieves sufficient suppression of extension of stacking fault also in this local region. By doing so, it becomes possible to suppress characteristic degradation of the MOSFET 711 sufficiently to be caused by the extension of the stacking fault in the SiC layer SL (FIG. 3). In this way, it is possible to suppress characteristic degradation of the MOSFET 711 while consideration increase in manufacturing cost is avoided.

If the surface density S in the thinned region part 101 is equal to or greater than 1/10 and equal to or less than 2/3 of the surface density S in the active region 100, contact resistivity in the thinned region part 101 is in a range from 1.5 to 10 times greater than contact resistivity in the standard region part 102. In this case, by giving consideration to the simulation result about the hole concentration distribution (FIG. 12), causing an excessively high local peak in the hole concentration distribution is avoided both in the vicinity of a boundary between the thinned region part 101 and the outer peripheral region 200 (in the vicinity of a position where x=0 in FIG. 12) and in the vicinity of a boundary between the thinned region part 101 and the standard region part 102 (in the vicinity of a position where x=−1 in FIG. 12). As a result, stacking fault is prevented from extending increasingly in the vicinity of each of these boundaries.

By giving consideration to the simulation result shown in FIG. 9, with the width of the thinned region part 101 (a dimension in the lateral direction in FIG. 2) of equal to or greater than 20% of a sum of the thickness of the SiC substrate 10 (FIG. 3) and the thickness of the SiC layer SL (FIG. 3), local increase in a bipolar current is suppressed in a substantially entire range where the local increase in the bipolar current is particularly serious. This effect is achieved more sufficiently if this percentage reaches as high as about 70%. For the reason described above in relation to this simulation, the effect is achieved nearly ideally if the percentage reaches as high as about 110%. Thus, in terms of the viewpoint of avoiding the ratio of the thinned region part 101 from being excessively high in the active region 100, an upper limit of this percentage may be set to 110% or may be set to 70%.

Current density in the MOSFET 711 in the ON state may be equal to or greater than 100 A/cm$^2$. With such high current density, causing holes in large quantity to flow into the drift layer 20 generates significant conductivity modulation. Thus, resistivity in the drift layer 20 is reduced considerably. A bipolar current is increased locally under such a condition, and such increase can be suppressed effectively by the present embodiment.

According to the present embodiment, in the standard region part 102, the shapes of the first well regions 30 (FIG. 4) are polygonal shapes (more specifically, rectangular shapes, still more specifically, square shapes) arranged repeatedly. This allows each of the first well regions 30 to be given an outer periphery of the polygonal shape in a plan view.

<1-7. Modifications of First Embodiment>

Figure 13:
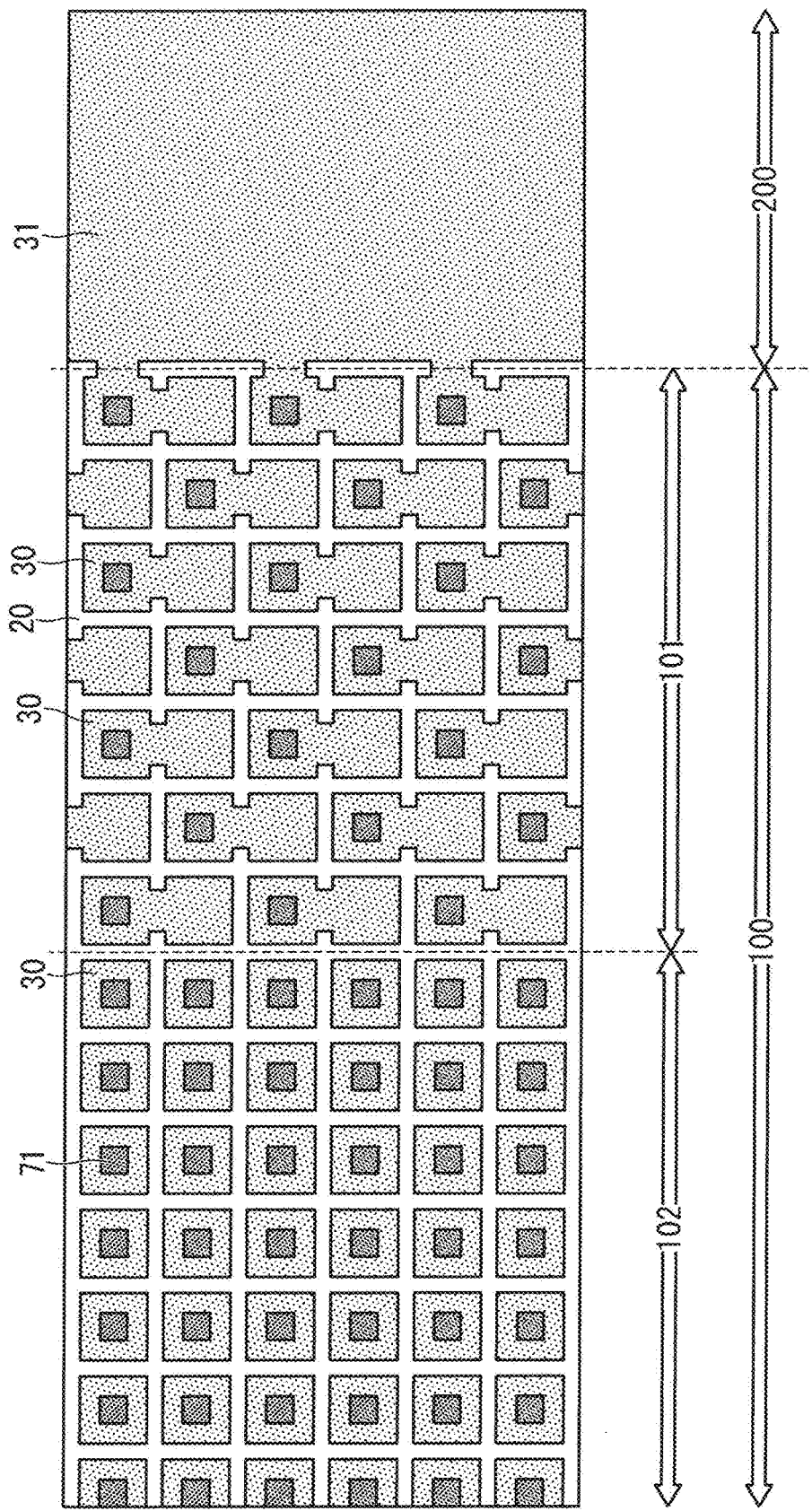
FIG. 13 is a partial top view showing a first modification of the configuration shown in FIG. 4.

FIG. 13 is a partial top view showing an MOSFET 712 (silicon carbide semiconductor device) as a first modification of the MOSFET 711 (FIG. 4). Unlike in the MOSFET 711 (FIG. 4), in the MOSFET 712 (FIG. 13), the surface region 71 is arranged at a position displaced from the second well region 31. In other words, the ohmic electrode 70 (FIG. 3) is arranged at a position displaced from a position over the second well region 31. Unlike in the first embodiment described above, in the present modification, the second well region 31 (FIG. 13) is connected at a boundary area between the outer peripheral region 200 and the active region 100 to the first well region 30.

Figure 14:
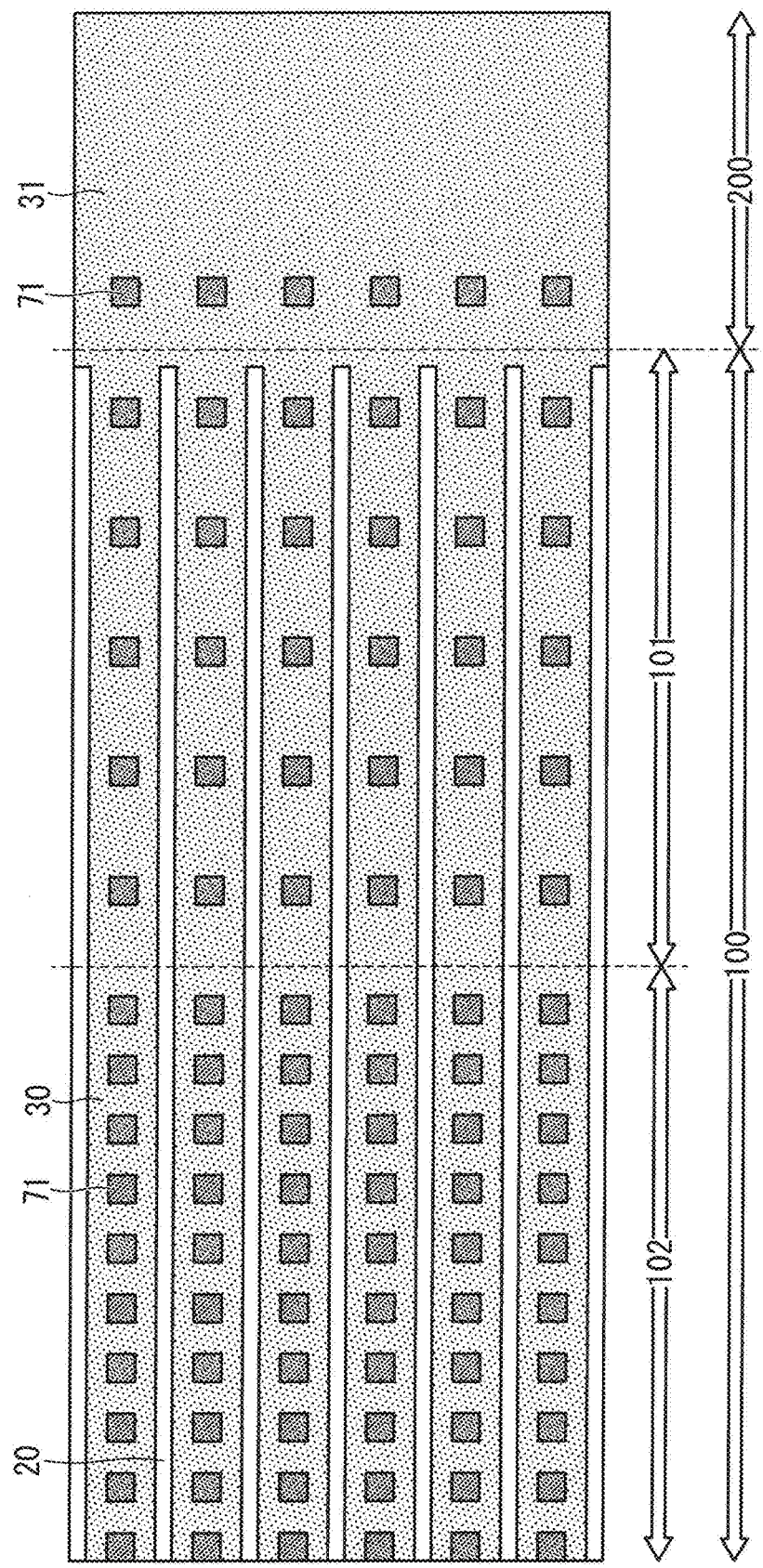
FIG. 14 is a partial top view showing a second modification of the configuration shown in FIG. 4.

FIG. 14 is a partial top view showing an MOSFET 713 (silicon carbide semiconductor device) as a second modification of the MOSFET 711 (FIG. 4). Unlike in the MOSFET 711 (FIG. 4), in the MOSFET 713 (FIG. 14), the first well regions 30 are arranged in a stripe pattern in an in-plane direction.

Figure 15:
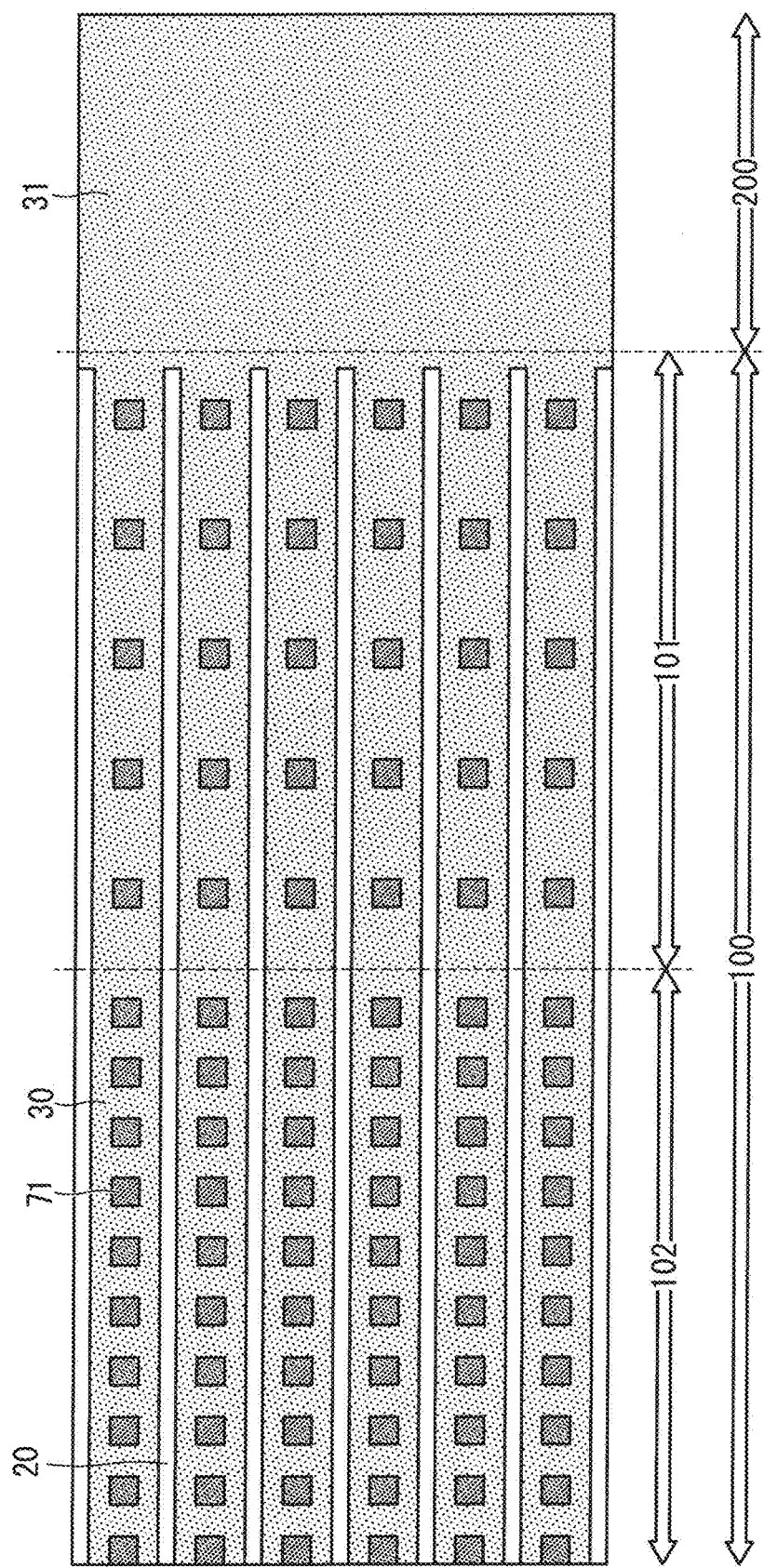
FIG. 15 is a partial top view showing a third modification of the configuration shown in FIG. 4.

FIG. 15 is a partial top view showing an MOSFET 714 (silicon carbide semiconductor device) as a third modification of the MOSFET 711 (FIG. 4). In the MOSFET 714 (FIG. 15), the surface region 71 is arranged at a position displaced from the second well region 31 like in the MOSFET 712 (FIG. 13) and the first well regions 30 are arranged in a stripe pattern in an in-plane direction like in the MOSFET 713 (FIG. 14).

Figure 16:
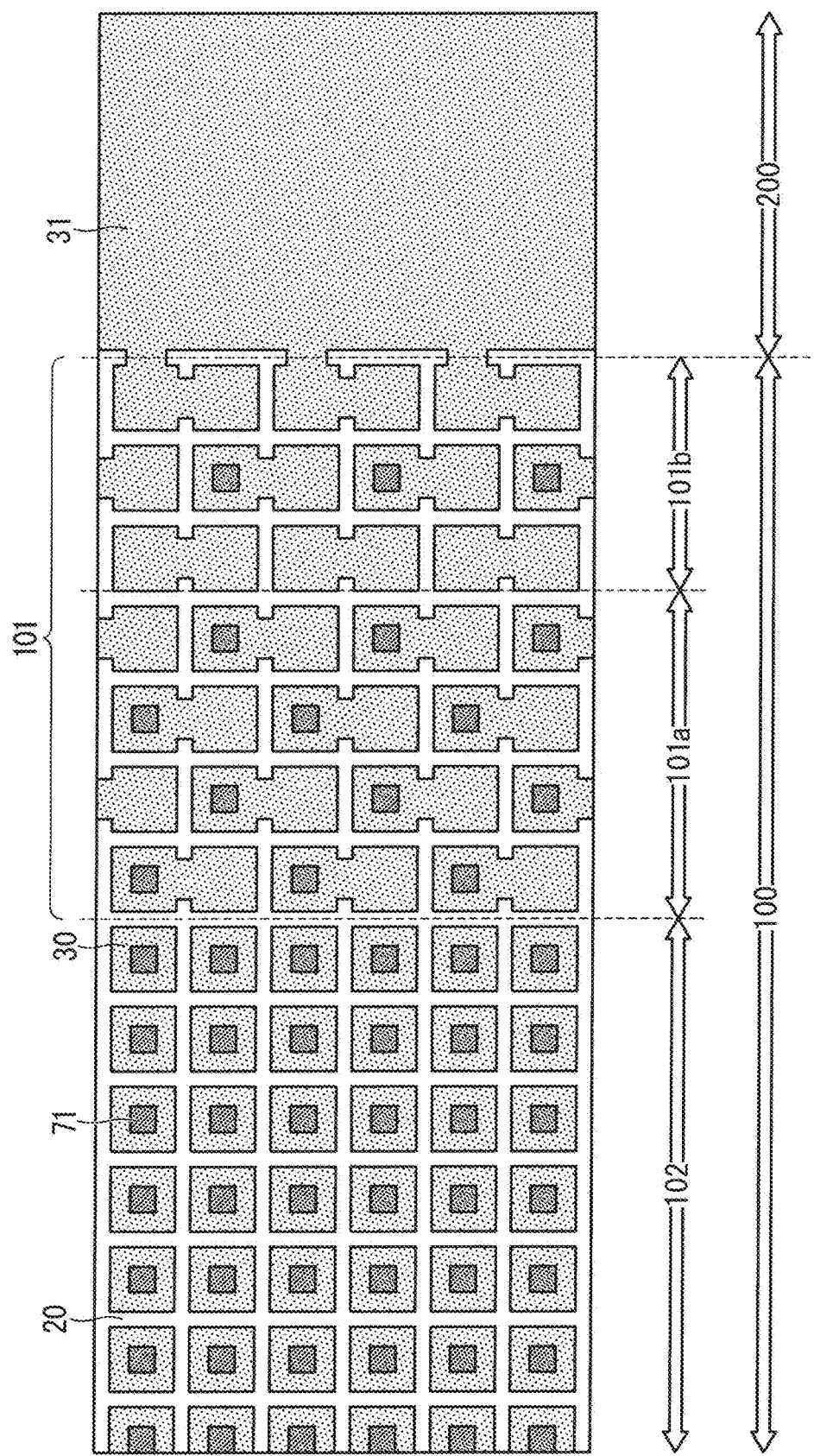
FIG. 16 is a partial top view showing a fourth modification of the configuration shown in FIG. 4.

FIG. 16 is a partial top view showing an MOSFET 715 (silicon carbide semiconductor device) as a fourth modification of the MOSFET 711 (FIG. 4). In the MOSFET 715 (FIG. 16), the surface density of the surface regions 71 in the thinned region part 101 is reduced further with a shorter distance to an external side (a right side in FIG. 16). More specifically, the thinned region part 101 is composed of a plurality of areas as viewed from an internal side toward the external side (toward the right side in FIG. 16), and surface density over these areas is reduced further with a shorter distance to the external side. In this way, the surface density in the thinned region part 101 has several levels. More specifically, the thinned region part 101 is composed of an area 101a and an area 101b arranged in this order as viewed from the internal side toward the external side, and surface density in the area 101b is lower than surface density in the area 101a. In this way, surface density in the thinned region part 101 is given a relatively high level in the area 101a and a relatively low level in the area 101b.

According to the above-described fourth modification, a degree of freedom in designing a distribution of surface density is increased. This makes it possible to achieve effect comparable to that described above achieved by the first embodiment while reducing the width of the thinned region part 101 (a dimension in a lateral direction in FIG. 16) further. While the number of levels of the surface density is two in the example shown in FIG. 16, the number of levels of the surface density is not limited to two. In a configuration according to a modification, a sufficiently larger number of levels may be prepared to reduce the surface density substantially continuously in the thinned region part 101 further with a shorter distance to the external side.

In each of the plan views of FIGS. 13 to 16, in an assumed sectional view (not shown in these drawings) cut along an oblique line (not shown in these drawings), the second well region 31 is present separately from the first well region 30 (like in the case of FIG. 3) in a manner depending on the position and direction of this oblique line. Thus, the first embodiment and the modifications thereof have a common feature in that the first well region 30 and the second well region 31 are separated from each other at least in one sectional view.

2. Second Embodiment

Figure 17:
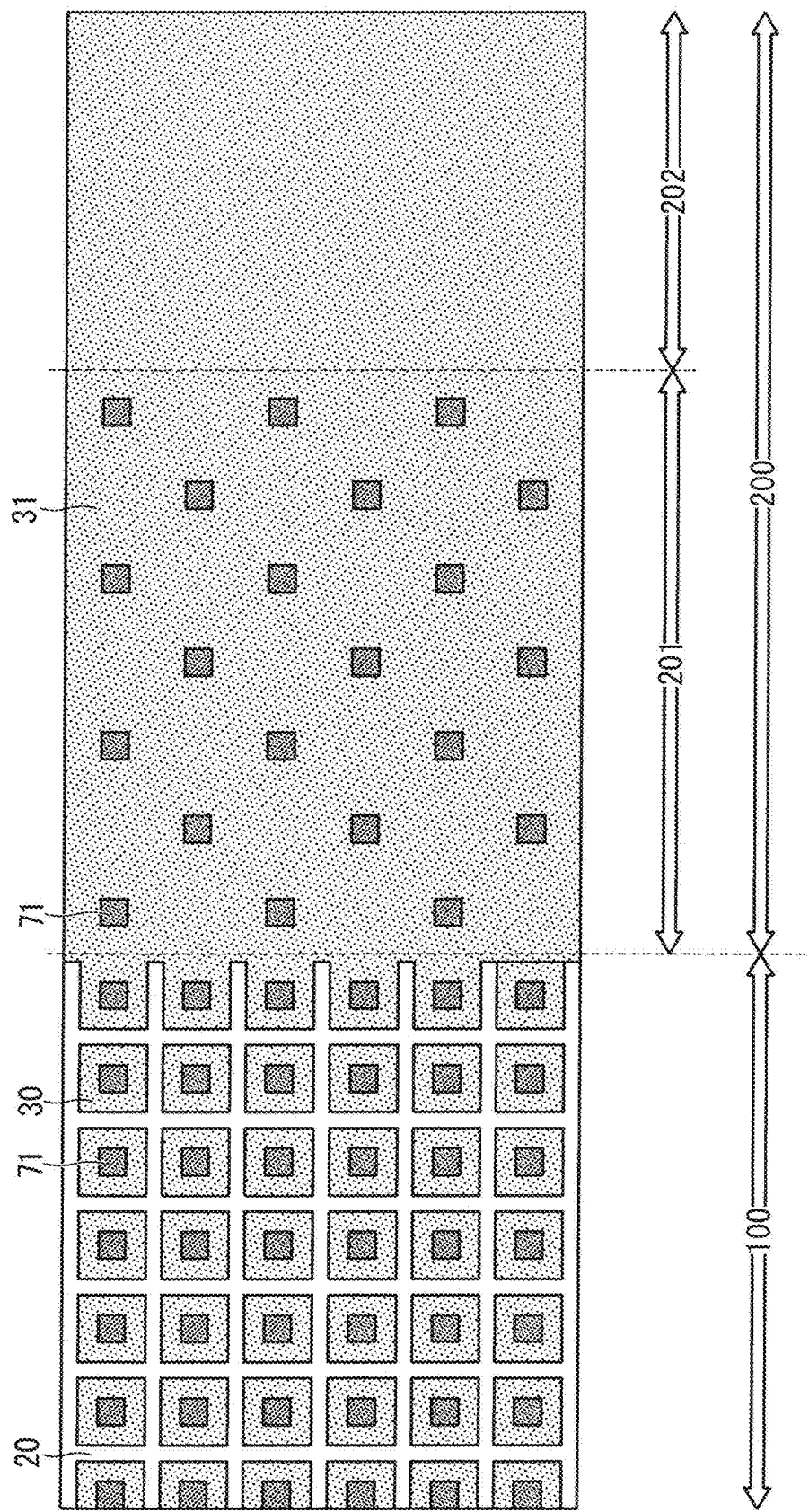
FIG. 17 is a partial top view schematically showing a first well region, a second well region, and a plurality of surface regions where part of an upper surface of a silicon carbide layer having a second conductivity type and a plurality of ohmic electrodes ohmically contact each other in a silicon carbide semiconductor device according to a second embodiment in a field of view similar to that of FIG. 4.

FIG. 17 is a partial top view schematically showing the configuration of an MOSFET 721 according to a second embodiment in a field of view similar to the field of view of FIG. 4 (first embodiment).

Unlike in the above-described first embodiment, in the second embodiment, the active region 100 is not required to include the thinned region part 101 (FIG. 4) but may be composed only of the standard region part 102 (FIG. 4), for example. On the other hand, in the second embodiment, the outer peripheral region 200 includes an external region part 202 and a thinned region part 201 between the external region part 202 and the active region 100.

The surface density of the surface regions 71 is lower in the thinned region part 201 than in the active region 100 in a plan view. Furthermore, the preferred relationship described above in the first embodiment between the surface density in the standard region part 102 (FIG. 4) and the surface density in the thinned region part 101 (FIG. 4) may also be applied to a relationship between the active region 100 (FIG. 17) and the thinned region part 201 (FIG. 17) of the second embodiment.

Structures other than those described above will not be described repeatedly as they are substantially the same as the corresponding structures of the first embodiment. Modifications similar to the modifications described in the first embodiment are also applicable to the second embodiment.

3. Third Embodiment

In the present embodiment, any of the silicon carbide semiconductor devices (MOSFETs 711 to 715 and 721) according to either of the embodiments or any of the modifications thereof described above is applied to a power converter. Such application of the silicon carbide semiconductor device is not limited to a particular power converter. Meanwhile, in the third embodiment described below, these silicon carbide semiconductor devices are applied to a three-phase inverter.

Figure 18:
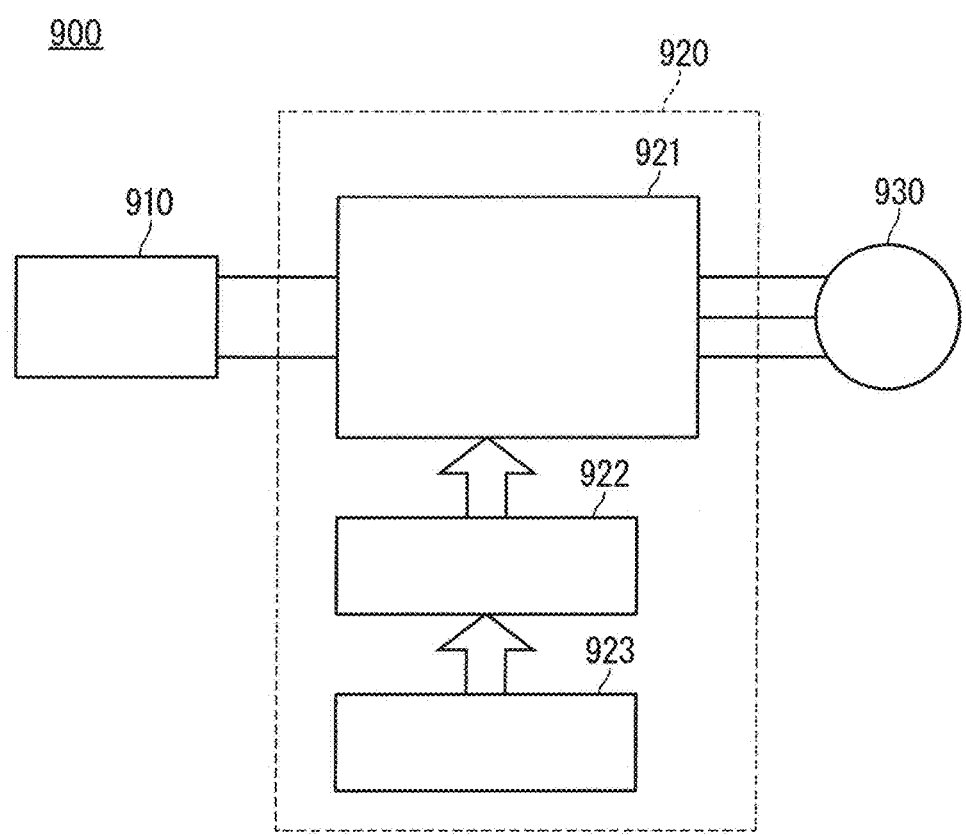
FIG. 18 is a block diagram showing the configuration of a power conversion system in which a power converter according to a third embodiment is employed.

FIG. 18 is a block diagram showing the configuration of a power conversion system according to the third embodiment. The power conversion system includes a power source 910, a power converter 920, and a load 930.

The power source 910 is a DC power source and supplies DC power to the power converter 920. The power source 910 may be composed of a DC system, a solar cell, or a rechargeable cell, for example, or may be composed of a rectifying circuit or an AC/DC converter connected to an AC system. Alternatively, the power source 910 may be composed of a DC/DC converter for converting DC power output from a DC system to certain power.

The power converter 920 is a three-phase inverter connected between the power source 910 and the load 930. The power converter 920 converts DC power supplied from the power source 910 to AC power and supplies the AC power to the load 930. The power converter 920 includes a main conversion circuit 921 that converts DC power to AC power and outputs the AC power, a driving circuit 922 that outputs a driving signal for driving each switching element of the main conversion circuit 921, and a control circuit 923 that outputs a control signal for controlling the driving circuit 922 to the driving circuit 922.

The load 930 is a three-phase electric motor that is driven by AC power supplied from the power converter 920. The load 930 is not limited to a load for a particular purpose of use but is an electric motor installed on any type of electric equipment, for example. As an example, the load 930 is used as an electric motor for a hybrid car, an electric car, a railway vehicle, an elevator, or an air conditioner.

The power converter 920 will be described next in detail. The main conversion circuit 921 accepts input power from the power source 910, converts the input power to output power, and provides the output power to the load 930. More specifically, the main conversion circuit 921 includes a switching element and a free-wheeling diode (not shown in the drawings). In response to switching of the switching element, DC power supplied from the power source 910 is converted to AC power, and the AC power is supplied to the load 930. While various specific circuit configurations are applicable to the main conversion circuit 921, the main conversion circuit 921 according to the third embodiment is a two-level three-phase full-bridge circuit. This circuit can be configured using six switching elements and six free-wheeling diodes connected inverse-parallel to corresponding ones of the switching elements. The silicon carbide semiconductor device according to either of the embodiments or any of the modifications thereof described above is applied to each of the switching elements of the main conversion circuit 921. Two switching elements of the six switching elements are connected in series to each other to form three upper arms and three lower arms. Each upper arm and each lower arm form a corresponding phase (U phase, V phase, W phase) of the full-bridge circuit. An output terminal of each upper arm and each lower arm, specifically, three output terminals of the main conversion circuit 921 are connected to the load 930.

The driving circuit 922 generates a driving signal for driving the switching element of the main conversion circuit 921, and supplies the generated driving signal to a control electrode for the switching element of the main conversion circuit 921. More specifically, in response to a control signal from the control circuit 923 described later, the driving circuit 922 outputs a driving signal for making an ON state of the switching element and a driving signal for making an OFF state of the switching element to the control electrode for this switching element. If the switching element is to be maintained in the ON state, the driving signal is a voltage signal (ON signal) at a voltage of equal to or greater than a threshold voltage of the switching element. If the switching element is to be maintained in the OFF state, the driving signal is a voltage signal (OFF signal) at a voltage of less than the threshold voltage of the switching element.

The control circuit 923 controls the switching element of the main conversion circuit 921 through the driving circuit 922 in such a manner as to supply intended power to the load 930. To achieve this object, on the basis of power to e supplied to the load 930, the control circuit 923 calculates a period (ON period) in which each switching element of the main conversion circuit 921 is to be in the ON state. For example, the main conversion circuit 921 is controllable through PWM control of modulating the ON period of the switching element in response to a voltage to be output. Then, the control circuit 923 outputs a control signal (control command) for controlling the driving circuit 922 to the driving circuit 922. In response to the output control signal, the driving circuit 922 outputs an ON signal or an OFF signal as a driving signal to the control electrode for each switching element. The control signal is generated by the control circuit 923 in such a manner that the driving circuit 922 outputs the ON signal to the switching element to be in the ON state at a corresponding moment and that the driving circuit 922 outputs the OFF signal to the switching element to be in the OFF state at a corresponding moment.

In the power converter according to the present embodiment, as the silicon carbide semiconductor device according to either of the embodiments or any of the modifications thereof described above is applied to the switching element of the main conversion circuit 921, it is possible to provide a power converter in which characteristic degradation is suppressed while considerable increase in manufacturing cost is avoided.

In the third embodiment, the two-level three-phase inverter is shown as an example of the power converter. However, this is not the only power converter to which the silicon carbide semiconductor device according to either of the embodiments or any of the modifications thereof described above is applied. The power converter may be a multilevel power converter of three levels or more or may be a single-phase inverter that supplies power to a single-phase load, for example. If power is to be supplied to a DC load, for example, the power converter may be a DC/DC converter or an AC/DC converter.

Moreover, the power converter to which the silicon carbide semiconductor device according to either of the embodiments or any of the modifications thereof described above is applied may be used in a case not limited to the case where the above-described load is an electric motor. For example, the power converter is usable as a power source device for an electric discharge machine, a laser beam machine, an induction heating cooker, or a non-contact feeding system, or a non-contact feeding system. Alternatively, the power converter is usable as a power conditioner for a solar energy generation system or an electricity storage system, for example.

The embodiments can be combined freely or each of the embodiments can be modified or omitted, if appropriate. While the present disclosure has been described in detail, the foregoing description is in all aspects illustrative and not restrictive. It is therefore understood that numerous modifications not shown can be devised from the present disclosure.

EXPLANATION OF REFERENCE SIGNS

10 SiC substrate (silicon carbide substrate)
20 Drift layer
30 First well region
31 Second well region
35 Contact region
40 Source region
50 Gate insulating film
60 Gate electrode
70 Ohmic electrode
71 Surface region
80 Source electrode
81 Gate pad
82 Gate interconnect line
84 Drain electrode
100 Active region
101, 201 Thinned region part
102 Standard region part
200 Outer peripheral region
202 External region part
711 to 715, 721 MOSFET (silicon carbide semiconductor device)
910 Power source
920 Power converter
921 Main conversion circuit
922 Driving circuit
923 Control circuit
930 Load
SL SiC layer (silicon carbide layer)

The invention claimed is:

1. A silicon carbide semiconductor device comprising:
a silicon carbide substrate having a first conductivity type;
a silicon carbide layer having a first surface facing the silicon carbide substrate and a second surface opposite the first surface in a thickness direction, and having an active region and an outer peripheral region arranged along an outer periphery of the active region in an in-plane direction vertical to the thickness direction, the silicon carbide layer including:
a drift layer arranged on the silicon carbide substrate and having the first conductivity type;
a plurality of first well regions arranged on the drift layer in the active region, having a second conductivity type different from the first conductivity type, and separated from each other at least in one sectional view;
a plurality of source regions arranged on the first well regions and having the first conductivity type; and
a second well region arranged on the drift layer in the outer peripheral region and having the second conductivity type;
a gate insulating film facing the first well regions;
a gate electrode having a part that is arranged over the active region and faces the first well regions across the gate insulating film, and a part that is arranged over the outer peripheral region and insulated from the second well region;
a gate pad arranged over the second well region, insulated from the second well region, and connected to the gate electrode;
a source electrode provided over the second surface of the silicon carbide layer; and
a plurality of ohmic electrodes provided on the second surface of the silicon carbide layer, connected to the source electrode, electrically and ohmically connected to the first well regions, and having a plurality of surface regions ohmically contacting a part of the second surface of the silicon carbide layer, the part of the second surface of the silicon carbide layer having the second conductivity type,
wherein the active region includes a standard region part and a thinned region part between the standard region part and the outer peripheral region, the surface regions being arranged at surface density lower in the thinned region part than in the standard region part in a plan view, and
wherein the thinned region part has a width that is equal to or greater than 20% of a sum of the thickness of the silicon carbide substrate and the thickness of the silicon carbide layer, the width corresponding to a distance between the standard region part and the outer peripheral region.

2. The silicon carbide semiconductor device according to claim 1, wherein:
the ohmic electrodes are arranged at positions displaced from a position over the second well region.

3. The silicon carbide semiconductor device according to claim 1, wherein:
the first well regions are arranged in a stripe pattern in the in-plane direction.

4. The silicon carbide semiconductor device according to claim 1, wherein:
in the in-plane direction, the first well regions have polygonal shapes arranged repeatedly in the standard region part.

5. The silicon carbide semiconductor device according to claim 1, wherein:

the surface density in the thinned region part is equal to or greater than 1/10 and equal to or less than 2/3 of the surface density in the active region.

6. The silicon carbide semiconductor device according to claim 1, wherein:
the surface density in the thinned region part is reduced further with a shorter distance to an external side.

7. The silicon carbide semiconductor device according to claim 1, wherein:
the surface density in the thinned region part has several levels.

8. The silicon carbide semiconductor device according to claim 1, wherein:
current density in an ON state is equal to or greater than 100 A/cm$^2$.

9. A power converter comprising:
a main conversion circuit that includes the silicon carbide semiconductor device according to claim 1, accepts input power, converts the input power to output power, and provides the output power;
a driving circuit that outputs a driving signal for driving the silicon carbide semiconductor device to the silicon carbide semiconductor device; and
a control circuit that outputs a control signal for controlling the driving circuit to the driving circuit.

10. A silicon carbide semiconductor device comprising:
a silicon carbide substrate having a first conductivity type;
a silicon carbide layer having a first surface facing the silicon carbide substrate and a second surface opposite the first surface in a thickness direction, and having an active region and an outer peripheral region arranged along an outer periphery of the active region in an in-plane direction vertical to the thickness direction, the silicon carbide layer including:
  a drift layer arranged on the silicon carbide substrate and having the first conductivity type;
  a plurality of first well regions arranged on the drift layer in the active region, having a second conductivity type different from the first conductivity type, and separated from each other at least in one sectional view;
  a plurality of source regions arranged on the first well regions and having the first conductivity type; and
  a second well region arranged on the drift layer in the outer peripheral region and having the second conductivity type;
a gate insulating film facing the first well regions;
a gate electrode having a part that is arranged over the active region and faces the first well regions across the gate insulating film, and a part that is arranged over the outer peripheral region and insulated from the second well region;
a gate pad arranged over the second well region, insulated from the second well region, and connected to the gate electrode;
a source electrode provided over the second surface of the silicon carbide layer; and
a plurality of ohmic electrodes provided on the second surface of the silicon carbide layer, connected to the source electrode, electrically and ohmically connected to the first well regions and the second well region, and having a plurality of surface regions ohmically contacting a part of the second surface of the silicon carbide layer, the part of the second surface of the silicon carbide layer having the second conductivity type,
wherein the outer peripheral region includes an external region part and a thinned region part between the external region part and the active region, the surface regions being arranged at surface density lower in the thinned region part than in the active region in a plan view, and
wherein the thinned region part has a width that is equal to or greater than 20% of a sum of the thickness of the silicon carbide substrate and the thickness of the silicon carbide layer, the width corresponding to a distance between the active region and the external region part.

11. The silicon carbide semiconductor device according to claim 10, wherein:
the width of the thinned region part is equal to or less than 110% of a sum of a thickness of the silicon carbide substrate and a thickness of the silicon carbide layer.

12. The silicon carbide semiconductor device according to claim 10, wherein:
the first well regions are arranged in a stripe pattern in the in-plane direction.

13. The silicon carbide semiconductor device according to claim 10, wherein;
the surface density in the thinned region part is equal to or greater than 1/10 and equal to or less than 2/3 of the surface density in the active region.

14. The silicon carbide semiconductor device according to claim 10, wherein;
the surface density in the thinned region part is reduced further with a shorter distance to an external side.

15. The silicon carbide semiconductor device according to claim 10, wherein;
the surface density in the thinned region part has several levels.

16. The silicon carbide semiconductor device according to claim 10, wherein;
current density in an ON state is equal to or greater than 100 A/cm$^2$.

17. A power converter comprising:
a main conversion circuit that includes the silicon carbide semiconductor device according to claim 10, accepts input power, converts the input power to output power, and provides the output power;
a driving circuit that outputs a driving signal for driving the silicon carbide semiconductor device to the silicon carbide semiconductor device; and
a control circuit that outputs a control signal for controlling the driving circuit to the driving circuit.

* * * * *